US008132611B2

(12) United States Patent
Cohn et al.

(10) Patent No.: US 8,132,611 B2
(45) Date of Patent: Mar. 13, 2012

(54) METALLIC NANOSTRUCTURES SELF-ASSEMBLY, AND TESTING METHODS

(75) Inventors: Robert W. Cohn, Louisville, KY (US); Mehdi M. Yazdanpanah, Louisville, KY (US); Steven A. Harfenist, San Luis Obispo, CA (US); Frank P. Zamborini, Louisville, KY (US); Mahdi Hosseini, Ginalary (AU); Santosh Pabba, Louisville, KY (US); Vladimir Dobrokhotov, Louisville, KY (US); Abdelilah Safir, Louisville, KY (US); Brigitte H. Fasciotto, Louisville, KY (US)

(73) Assignee: University of Louisville Research Foundation, Inc., Louisville, KY (US)

( * ) Notice: Subject to any disclaimer, the term of this patent is extended or adjusted under 35 U.S.C. 154(b) by 611 days.

(21) Appl. No.: 12/156,534

(22) Filed: Jun. 2, 2008

(65) Prior Publication Data

US 2009/0082216 A1    Mar. 26, 2009

Related U.S. Application Data

(60) Provisional application No. 60/932,919, filed on Jun. 1, 2007.

(51) Int. Cl.
*B22D 23/04* (2006.01)
(52) U.S. Cl. .............. 164/46; 164/271; 427/431
(58) Field of Classification Search ............. 164/46, 164/271
See application file for complete search history.

(56) References Cited

U.S. PATENT DOCUMENTS

| 4,279,709 | A | * | 7/1981 | McIntyre et al. ............. 205/531 |
| 5,835,477 | A | | 11/1998 | Binnig et al. |
| 6,218,086 | B1 | | 4/2001 | Binnig et al. |
| 6,249,747 | B1 | | 6/2001 | Binnig et al. |
| 6,280,647 | B1 | * | 8/2001 | Muramatsu et al. ........... 216/92 |
| 6,755,956 | B2 | | 6/2004 | Lee et al. |

FOREIGN PATENT DOCUMENTS

WO    WO 03/027011    4/2003
WO    WO 2007/058804    5/2007

OTHER PUBLICATIONS

Jiang, H. et al. "Dip-Pen Patterning and Surface Assembly of Peptide Amphiphiles." Langmuir (2005) 21 5242-5246.*
Kranz, Christine et al. "Integrating an Ultramicroelectrode in an AFM Cantilever: Toward the Development of Combined Microsensing Imaging Tools." Chapter 17, in Enviromnental Electrochemistry ACS Symposium Series, Washington, DC 2002.*
Hunt, T. P. et al. "Dielectrophoresis tweezers for single cell manipulation." Biomedical Microdevices (2006) 8 227-230.*

(Continued)

*Primary Examiner* — Yelena G Gakh
*Assistant Examiner* — Christopher A Hixson
(74) *Attorney, Agent, or Firm* — Greer, Burns & Crain Ltd.

(57) ABSTRACT

The invention provides method for metallic nanostructures self-assembly methods and materials testing. Preferred embodiment methods permit for the formation of individual nanostructures and arrays of nanostructures. The nanostructures formed can have a metal alloy crystal structure. Example structures include slender wires, rectangular bars, or plate-like structures. Tips can be shaped, single layer and multiple layer coatings can be formed, tips can be functionalized, molecules can be adhered, and many testing methods are enabled.

9 Claims, 12 Drawing Sheets

OTHER PUBLICATIONS

Patil, Amol et al. "Enhanced Functionality of Nanotube Atomic Force Microscopy Tips by Polymer Coating." Nano Letters (2004) 4 303-308.*

Strein, Timothy G. et al. "Characterization of Submicron-Sized Carbon Electrodes Insulated with a Phenol-Allylphenol Copolymer." Analytical Chemistry (1992) 64 1368-1373.*

Wang, Xuefeng et al. "Multifunctional Probe Array for Nano Patterning and Imaging." Nano Letters (2005) 5 1867-1872.*

Bhushan, Bharat, "The 'Millipede'—A Nanotechnology-Based AFM Data-Storage System", *Springer Handbook of Nanotechnology*, 2d Ed., 2007, pp. 1457-1486.

G. Binnig, M. Despont, U. Drechsler, W. Häberle, M. Lutwyche, P. Vettiger, H. J. Mamin, B. W. Chui, and T. W. Kenny, "Ultrahigh-Density Atomic Force Microscopy Data Storage with Erase Capability," *Applied Physics Letters*, vol. 74, No. 9, Mar. 1, 1999, pp. 1329-1331.

B. W. Chui, H. J. Mamin, B. D. Terris, D. Rugar, K. E. Goodson, and T. W. Kenny, "Micromachined Heaters with 1-µs. Thermal Time Constants for AFM Thermomechanical Data Storage," *Proceedings of IEEE Transducers '97*, Chicago, Jun. 1997, pp. 1085-1088.

M. Despont, J. Brugger, U. Drechsler, U. Dürig, W. Häberle, M. Lutwyche, H. Rothuizen, R. Stutz, R. Widmer, G. Binnig, H. Rohrer, and P. Vettiger, "VLSI—NEMS Chip for AFM Data Storage," *Technical Digest, 12th IEEE International Micro Electro Mechanical Systems Conference (MEMS'99)*, Orlando, FL, Jan. 1999, pp. 564-569; (b) idem, "VLSI—NEMS Chip for Parallel AFM Data Storage," *Sensors & Actuators A* (1999, in press).

V.V. Dobrokhotov, M.M. Yazdanpanah, S. Pabba, A. Safir and R.W. Cohn, "Visual Force Sensing with Flexible Nanowire Buckling Springs", Nanotechnology, vol. 19, 2008, pp. 035502-1-035502-9.

E. Grochowski and R. F. Hoyt, "Future Trends in Hard Disk Drives," *IEEE Transactions on Magnetics*, vol. 32, No. 3, May 1996, pp. 1850-1854.

M. Lutwyche, C. Andreoli, G. Binnig, J. Brugger, U. Drechsler, W. Häberle, H. Rohrer, H. Rothuizen, and P. Vettiger, "Microfabrication and Parallel Operation of 5×5 2D AFM Cantilever Array for Data Storage and Imaging," *Proceedings of the IEEE 11th International Workshop on Micro Electro Mechanical Systems (MEMS'98)*, Heidelberg, Germany, Jan. 1998, pp. 8-11.

M. Lutwyche, C. Andreoli, G. Binnig, J. Brugger, U. Drechsler, W. Häberle, H. Rohrer, H. Rothuizen, P. Vettiger, G. Yaraliglu, and C. Quate, "5×5 2D AFM Cantilever Arrays: A First Step Towards a Terabit Storage Device," *Sensors & Actuators A* 73, 1999, pp. 89-94.

H. J. Mamin and D. Rugar, "Thermomechanical Writing with an Atomic Force Microscope Tip," *Appl. Phys. Lett.*, vol. 61, Aug. 1992, pp. 1003-1005.

H. J. Mamin, B. D. Terris, L. S. Fan, S. Hoen, R. C. Barrett, and D. Rugar, "High-Density Data Storage Using Proximal Probe Techniques," *IBM J. Res. Develop.*, vol. 39, Nov. 6, 1995, pp. 681-700.

H. J. Mamin, R. P. Ried, B. D. Terris, and D. Rugar, "High-Density Data Storage Based on the Atomic Force Microscope," *Proceedings of the IEEE*, vol. 87, No. 6, Jun. 1999, pp. 1014-1027.

S. C. Minne, S. R. Manalis, A. Atalar, and C. F. Quate, "Independent parallel lithography using the atomic force microscope," *J. Vac. Sci. Technol. B*, vol. 14, No. 4, 1997, pp. 2456-2461.

S. C. Minne, S. R. Manalis, and C. F. Quate, "Parallel atomic force microscopy using cantilevers with integrated piezoresistive sensors and integrated piezoelectric actuators," *Appl. Phys. Lett*, vol. 67, No. 26, Dec. 25, 1995, pp. 3918-3920.

S. C. Minne, G. Yaralioglu, S. R. Manalis, J. D. Adams, A. Atalar, and C. F. Quate, "Automated Parallel High-Speed Atomic Force Microscopy," *Applied Physics Letters*, vol. 72, No. 18, May 4, 1998, pp. 2340-2342.

R. P. Ried, H. J. Mamin, B. D. Terris, L. S. Fan, and D. Rugar, "6-MHz 2-N/m Piezoresistive Atomic-Force-Microscope Cantilevers with Incisive Tips," *Journal of Microelectromechanical Systems*, vol. 6, No. 4, Dec. 1997, pp. 294-302.

H. Rothuizen, U. Drechsler, G. Genolet, W. Häberle, M. Lutwyche, R. Stutz, R. Widmer, and P. Vettiger, "Fabrication of a Micromachined Magnetic x/y/z Scanner for Parallel Scanning Probe Applications," *Proceedings of the International Conference on Micro- and Nano-Engineering (MNE '99)*, Rome, Italy, Sep. 21-23, 1999, *Microelectronic Engineering*, vol. 53, 2000, pp. 509-512.

B. D. Terris, S. A. Rishton, H. J. Mamin, R. P. Ried, and D. Rugar, "Atomic Force Microscope-Based Data Storage: Track Servo and Wear Study," *Appl. Phys. A*, vol. 66, 1998, pp. S809-S813.

D. A. Thompson and J. S. Best, "The Future of Magnetic Data Storage Technology," *IBM J. Res. Develop.*, vol. 44, No. 3, May 2000, pp. 311-322.

P. Vettiger, M. Despont, U. Drechsler, U. Dürig, W. Häberle, M. I. Lutwyche, H. E. Rothuizen, R. Stutz, R. Widmer, G. K. Binnig, "The 'Millipede'—More than one thousand tips for future AFM data storage," *IBM J. Res. Develop.* 444, 323-340 (2000).

P. Vettiger, J. Brugger, M. Despont, U. Drechsler, U. Dürig, W. Häberle, M. Lutwyche, H. Rothuizen, R. Stutz, R. Widmer, and G. Binnig, "Ultrahigh Density, High-Data-Rate NEMS-Based AFM Data Storage System," *Microelectronic Engineering*, vol. 46, 1999, pp. 11-17.

S. Wu, S.R. Park, X. S. Ling, "Lighography-Free Formation of Nanopores in Plastic Membranes Using Laser Heating", *Nano Letters*, vol. 6, No. 11, 2006, pp. 2571-2576.

S. M. Berry, S. A. Harfenist, R. W. Cohn and R. S. Keynton, "Characterization of micromanipulator-controlled dry spinning of micro- and sub-microscale polymer fibers," Jul. 28, 2006, *J. Micromech. Microeng*.vol. 16, pp. 1825-1832.

V. V. Dobrokhotov, M. M. Yazdanpanah, S. Pabba, A. Safir, R. W. Cohn, "Visual force sensing with flexible nanowire buckling springs," Nanotechnology, vol. 19 (2008), Published Dec. 11, 2007.

S. Pabba, S. M. Berry, M. M. Yazdanpanaah, R. S. Keynton and R. W. Cohn, "Nanotube suspension bridges directly fabricated from nanotube-polymer suspensions by manual brushing," *6th IEEE Conference on Nanotechnology*, 565-568 (Jul. 18, 2006, Cincinnati, OH).

S. Pabba, A. N. Sidorov, S. M. Berry, M. M. Yazdanpanah, R. S. Keynton, G. U. Sumanasekera and R. W. Cohn, "Oriented Nanomaterial Air Bridges Formed from Suspended Polymer-Composite Nanofibers," Published Aug. 14, 2007, *ACS Nano* 2007 1(1), pp. 57-62.

A.Safir, M. M. Yazdanpanah, S. Pabba, S. D. Cambron, F. P. Zamborini, R. S. Keynton, and R. W. Cohn, "Fabrication of an insulated probe on a self-assembled metallic nanowire for electrochemical probing in cells," *6th IEEE Conference on Nanotechnology*, vol. 2, 898-900 (Jul. 19, 2006, Cincinnati, OH).

M. M. Yazdanpanah, S. A. Harfenist, A. Safir and R. W. Cohn, "Selective self-assembly at room temperature of individual freestanding $Ag_2Ga$ alloy nanoneedles," *J. Appl. Phys.* 98, 073510 (Oct. 5, 2005).

M. M. Yazdanpanah, S. Chakraborty, S. A. Harfenist, R. W. Cohn, and B. W. Alphenaar, "Formation of highly transmissive liquid metal contacts to carbon nanotubes," *Appl. Phys. Lett.* 85, 3564 (Oct. 18, 2004).

M. M. Yazdanpanah, S. A. Harfenist and R. W. Cohn, "Gallium-driven assembly of gold nanowire networks," *Appl. Phys. Lett.* 85, 1592 (Aug. 30, 2004).

M. M. Yazdanpanah, S. A. Harfenist, A. Safir, R. W. Cohn, "Individually and selectively grown Ag-Ga nanowires and their applications in nanomechanics and nanolithography," Integration Strategies and Applications of Nanowires session, 1st Topical Symposium on Nanowires, Annual Meeting American Institute of Chemical Engineers, Cincinnati, OH (Nov. 2, 2005).

M.M. Yazdanpanah, S. A. Harfenist, A. Safir and R. W. Cohn "Room temperature in-situ growth of individual Ag2Ga nanoneedle as AFM tips," American Physical Society March Meeting, paper J26-11, p. 512, Los Angeles, CA (Mar. 22, 2005), Abstract available at http://meetings.aps.org/link/BAPS.2005.MAR.J26.11.

M. M. Yazdanpanah, "Near Room Temperature Self-Assembly of Nanostructures by Reaction of Gallium with Metal Thin Films," (PhD dissertation, University of Louisville, 2006).

M. M. Yazdanpanah, S. A. Harfenist, A. Safir and R. W. Cohn, "Room Temperature, Selectively Self-Assembled, Freestanding Alloy Nanoneedles of Ag2Ga," Physical Electronics Conference, Madison, WI. (Jun. 20, 2005).

M.M. Yazdanpanah, M. Hosseini, S. Pabba, S.M. Berry, V.V. Dobrokhotov, A. Safir, R.S. Keynton, R.W. Cohn "Rheological Measurements by AFM of the Formation of Polymer Nanofibers," Jun. 2007 Society of Experimental Mechanics Annual Conference & Exposition, Springfield, MA.

M. M. Yazdanapanah, M. Hosseini, S. Pabba, B. H. Fasciotto, S. M. Berry, V. V. Dobrokhotov, A. Safir, R. S. Keynton, R. W. Cohn, "Nanoneedles for biomaterial synthesis and materials characterization of live cells," Society for the Advancement of Material and Process Engineering (SAMPLE) Fall Technical Conference (39$^{th}$ ISTC), Cincinnati, OH, Oct. 29-Nov. 1, 2007.

* cited by examiner

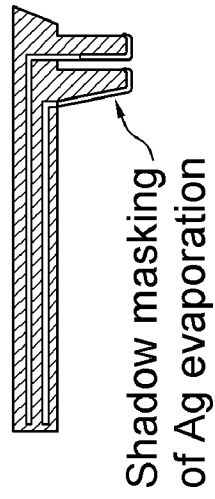
FIG. 4A
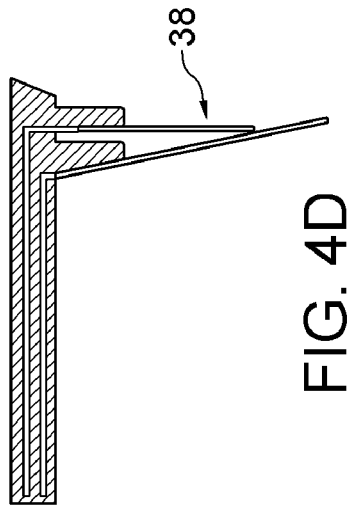
FIG. 4B
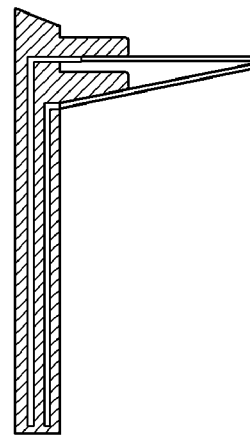
FIG. 4D
FIG. 4E
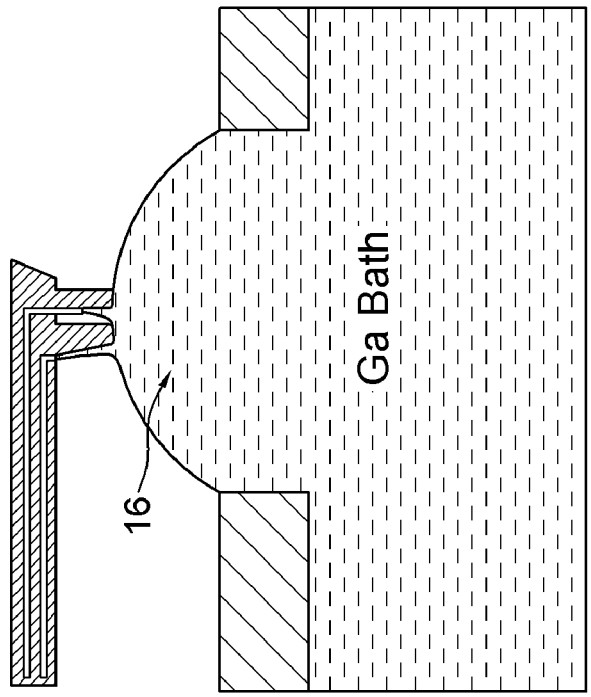
FIG. 4C

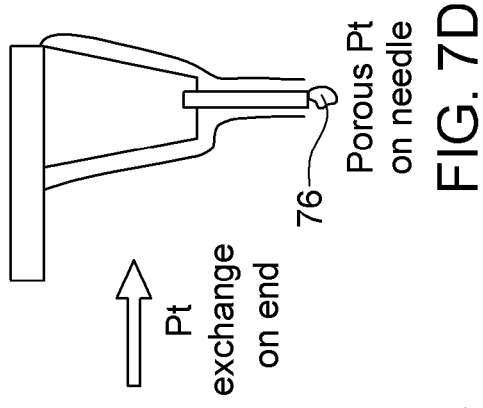
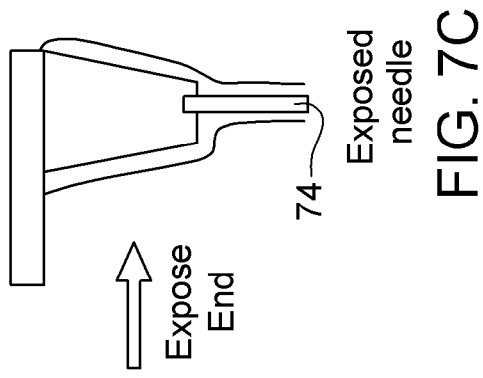
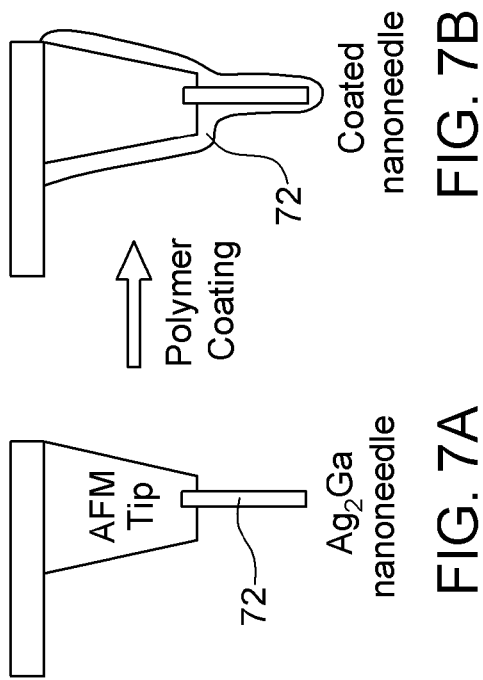
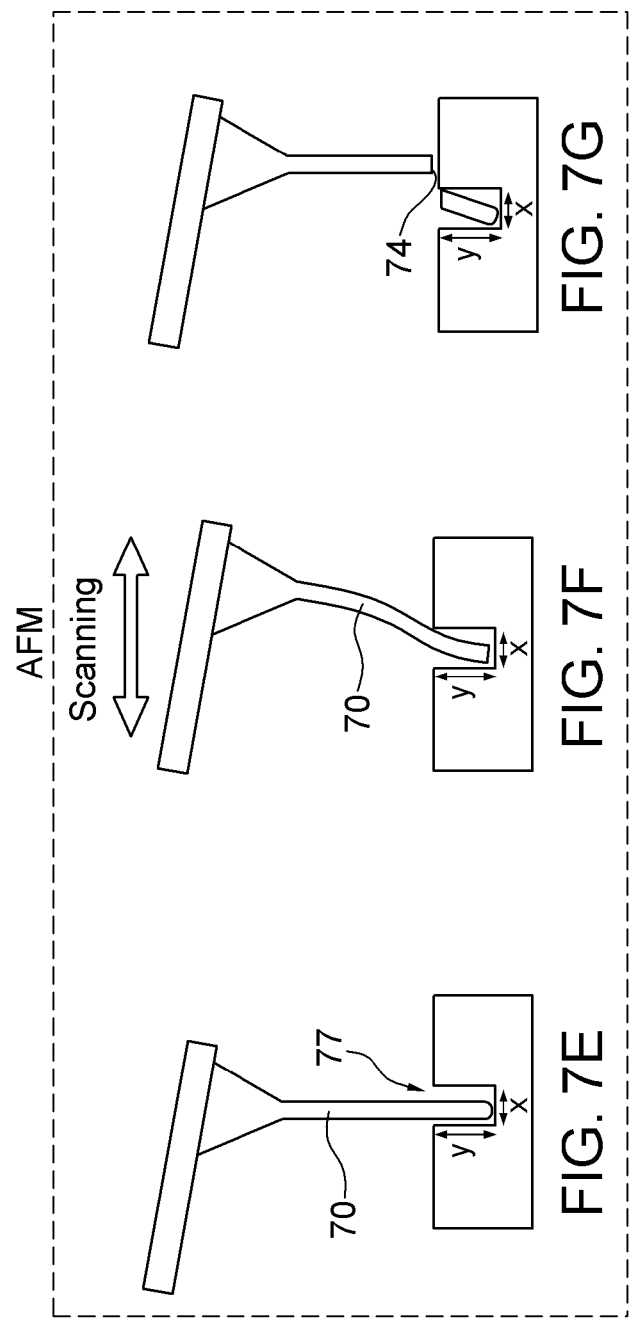

METALLIC NANOSTRUCTURES SELF-ASSEMBLY, AND TESTING METHODS

PRIORITY CLAIM AND REFERENCE TO RELATED APPLICATION

This application claims priority from prior provisional application Ser. No. 60/932,919, which was filed on Jun. 1, 2007.

STATEMENT OF GOVERNMENT INTEREST

This invention was made with Government support under Grant ECS-0506941 awarded by National Science Foundation and cooperative agreement NCC5-571 awarded by National Aeronautics and Space Administration. The government has certain rights in the invention.

FIELD

Fields of the invention include nanostructures, the fabrication of nanostructures and nanostructure applications. An example application of the invention is to sensors, such as micromechanical sensors, including those based upon atomic force microscopy and micro-electro-mechanical and nano-electromechanical systems referred to as MEMS and NEMS devices, respectively. Particular example applications are to measure physical properties of liquids (i.e., viscosity, surface tension, evaporation rate, contact angle, etc.), and to measure material mechanical properties of solids, including stress, dimensions, stiffness, elasticity, etc. Chemical and electrochemical properties can also be measured with nanostructures, including for example, properties of living cells.

BACKGROUND

Metallic nanostructures self-assemble through the evolution of material systems toward states of thermodynamic equilibrium. The difference between the free energy of the system in the initial and final states produces a force that drives the transformation of state. However, the system may also have to first climb an energy barrier before a spontaneous reaction can occur. A reaction can also go through several metastable states which each have excess free energy barriers that can stop the reaction before the thermodynamic minimum can be reached. As a result of the complex physics of metal systems there are numerous structures that can be realized. For instance, from a binary metal melt of iron and carbon, there are innumerable varieties of steel that can be produced through variations in cooling rates and the fraction of carbon to iron. The numerous types of transformations from one nanostructure morphology to another are found throughout the solidification process.

Self-assembly in metal and alloy systems is described by kinetics, or the evolution of a system toward a state of equilibrium. Excess free energy ($\Delta G$) above equilibrium can be due to any number of physical or thermodynamical variables e.g. temperature, pressure, chemical composition in binary (or m-ary) systems, electrical potential or gravitational potential. Therefore if a system is initially in equilibrium, an instantaneous change in a thermodynamic variable causes the system to evolve toward a new state of equilibrium. Since the system has been removed from a state of equilibrium there is a change in free energy which drives the reaction. Change in any variable can be associated with a "driving force" that pushes the system towards a state of equilibrium. Transformation between states, or phases, of matter is a function of various state variables such as temperature, pressure or composition. A change in the values of the variables can change the state of the material. For a material to be in a certain phase (in thermodynamic equilibrium) that phase must also have a Gibbs free energy, G that is lower than the energy of any other phases. At the boundaries of the phases (e.g., a ice-liquid boundary) multiple adjacent phases can coexist and have equal free energies. For spherical and rounded surfaces, small radii of curvature can significantly increase free energy (referred to as the Gibbs-Thomson effect) and significantly affect the solubility of the nanostructure in the surrounding material.

The term self-assembly describes the automatic and autonomous transformation from one state or configuration into another. Self-assembly offers the possibility of fabricating materials, structures, and devices with less effort and complexity than by traditional fabrication methods. This is especially appealing in the field of nanostructure fabrication, where with the continually decreasing feature sizes, the cost of traditional fabrication equipment (e.g. electron beam pattern generators, focused ion beam tools, x-ray lithography, extreme UV lithography systems) is becoming increasingly costly. Developing processes that self-assemble with adequate control, precision, and repeatability has great potential to reduce manufacturing costs of current conventional fabrication processes used in the fabrication of integrated circuits and other integrated devices [e.g. micro electro mechanical systems (MEMS), BioMEMS, Microflips, Lab-on-a-chip].

The ability to securely attach nanowires at desired locations has been quite limited and generally unsatisfactory for practical applications. One class of approaches has been to use mechanical manipulation or microfluidics to position a nanowire or nanotube near a surface followed by the application of an electric field or electron beam to attach the object. A second class of approach is to selectively grow nanowires on chemically patterned surfaces. Nanowires can be grown selectively from catalyst nanoparticles by plasma enhanced chemical vapor deposition. However, the required positioning of the nanoparticles at selected locations can be quite difficult due to the small size of the particles. Also, PECVD and other chemical vapor deposition (CVD) methods are usually performed at high temperatures that can damage the substrate material.

SUMMARY OF THE INVENTION

The invention provides methods for metallic nanonstructures self-assembly and materials testing. Preferred embodiment methods permit for the formation of individual nanostructures and arrays of nanostructures. The nanostructures formed can have a metal alloy crystal structure. Example structures include slender wires, rectangular bars, or plate-like structures. Tips can be shaped, single layer and multiple layer coatings can be formed, tips can be functionalized, molecules can be adhered, and many testing methods are enabled.

In preferred methods of the invention, formed nanostructures are coated with an insulated layer, such as a polymer. In an example embodiment, the nanostructure is a nanoneedle and the polymer is then removed polymer from a tip of the nanoneedle via side-to-side flexing during contact mode scanning of a deep and narrow trench in an atomic force microscope (AFM). In preferred embodiments, a nanoneedles is coated with alternating layers of insulator and metal.

Removing the layers from the tip of the nanoneedle creates a multiconductor (e.g. coaxial, triaxial, quadaxial) nanoelectrode.

Preferred embodiment nanoneedles include sharpened tips. A preferred step of sharpening a tip of the nanoneedle is conducted by vibrating the nanoneedle against a surface. Another preferred method of sharpening a tip of the nanoneedle is by selectively etching the end of the needle into an etchant forming a meniscus between the needle tip and the etchant.

In preferred nanoneedle formation methods, opposing nanoneedles are formed. The opposing nanoneedles are electrically connected to a contact to form electrostatically actuated nanogrippers.

In preferred method for biomolecular separation, an array of nanoneedles is contacted with a plurality of liquid metal droplets. The formed nanoneedle array is dipped into a liquid including a mixture of molecules. Voltage is applied to each individual nanoneedle, which are dipped into individual dishes. Voltage is applied to deposit molecules.

In a preferred method of using nanoneedles for measurement of the rheological properties of liquid, a nanoneedle is contacted to the liquid. Properties related to the contact of the nanoneedle with the liquid are measured and rheological properties of the liquid are calculated.

In a preferred method of forming metal pores, metal alloy nanostructures are formed. Selectively removal of a metal forms pores in the nanostructure.

In a preferred method for forming polymer fibers, a nanoneedle tip having a substantially constant diameter is used to draw a polymer fiber from a polymer droplet. The polymer fiber is drawn to another droplet. The polymer fiber is permitted to solidify into one or a plurality of suspended air bridges and suspended arrays.

In a preferred method for forming nanofiber air bridges, a liquid polymer is brushed with dispersed nanomaterials over a plurality of micropillars. The solution is permitted to solidify into a nanomaterials-polymer composite. The polymer is decomposed to form nanomaterial air bridges

BRIEF DESCRIPTION OF THE DRAWINGS

FIGS. 4A-4E illustrate a preferred embodiment process for the formation of nanotweezers;

FIGS. 7A-7G illustrate a preferred embodiment process for forming polymer coated nanoneedles and exposed and porous tipped polymer coated nanoneedles;

DETAILED DESCRIPTION OF THE PREFERRED EMBODIMENTS

Figure 1A:
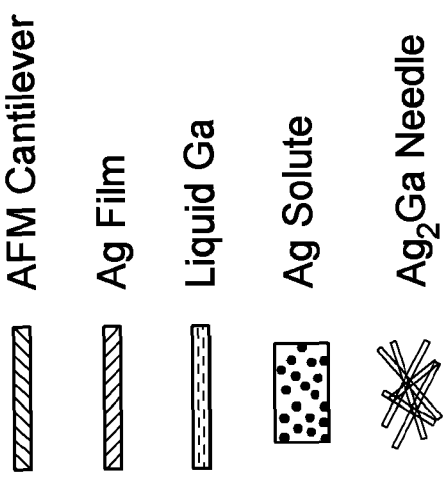
FIGS. 1A-1D illustrate a preferred method for the formation of a single nanowire/nanoneedle or other metal nanostructures at a particular location and with a particular orientation.
Figure 1B:
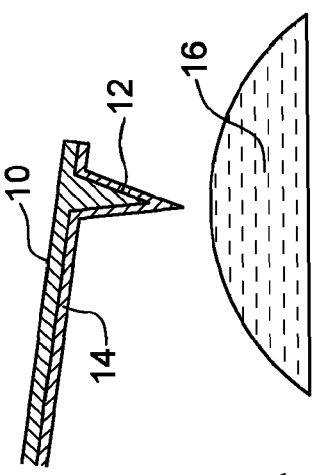
Figure 1C:
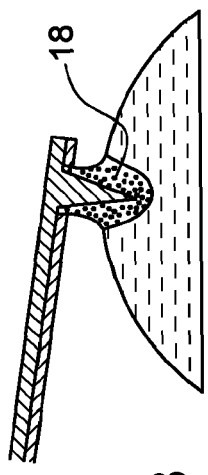
Figure 1D:
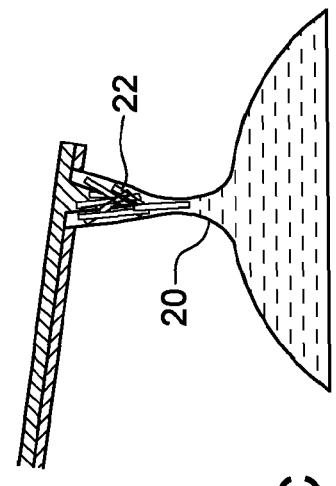
Figure 2A:
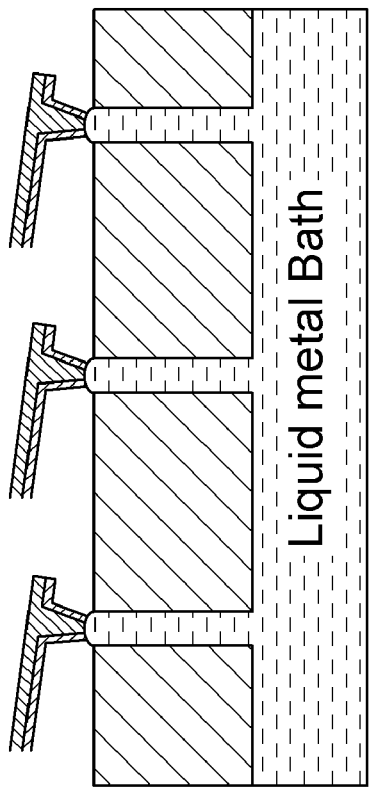
FIGS. 2A-2D illustrate a preferred method for parallel fabrication of an array of free-standing nanoneedles with a controlled orientation and location.
Figure 2B:
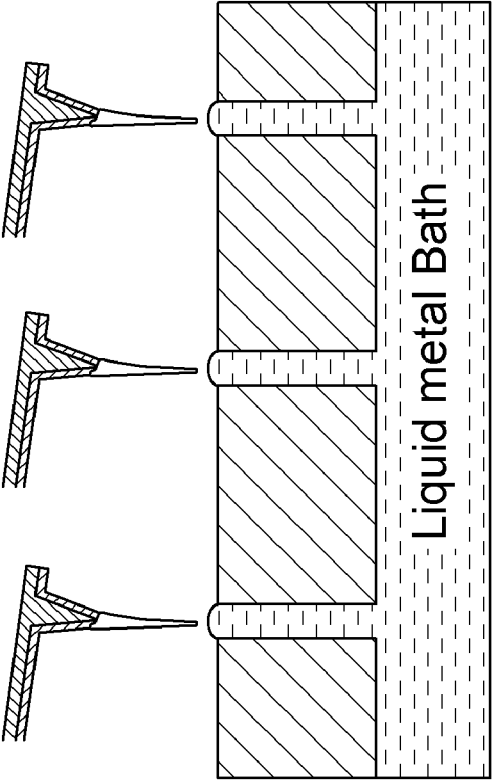
Figure 2C:
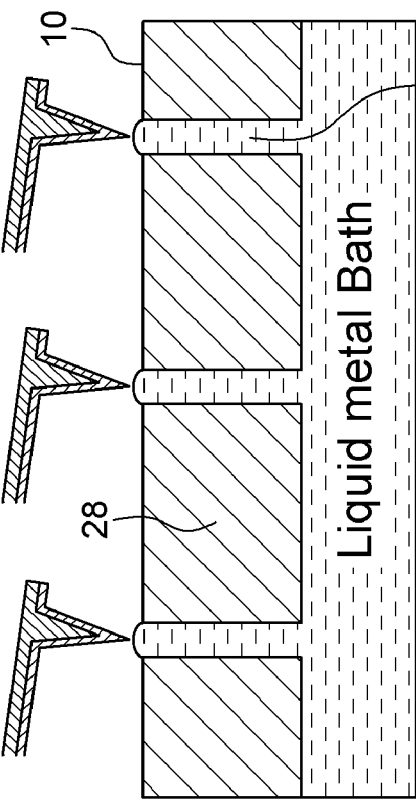
Figure 2D:
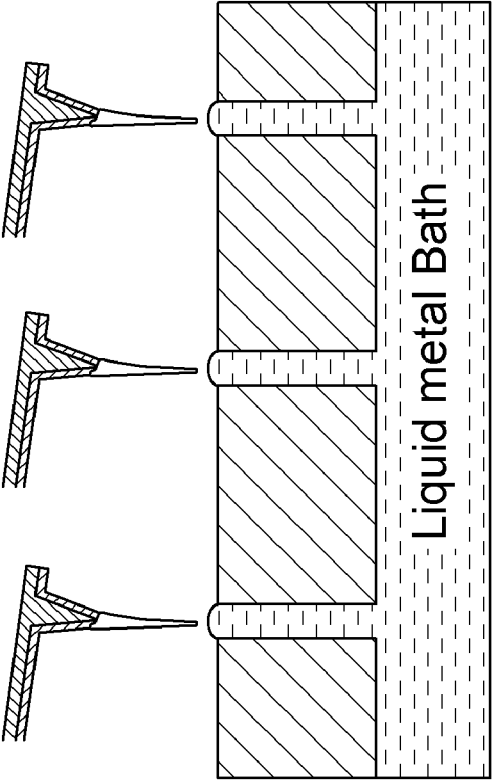

An embodiment of the invention is a method for the fabrication of nanostructures, including nanoplatforms, nanoneedles, nanocapillaries, and arrays of nanoneedles and other structures. In a preferred embodiment method, portions of a room temperature liquid metal droplet are drawn onto a microscopic support. The materials of the support are selected to produce a particular nanostructure, e.g., a nanoneedle or nanoplatform having a predictable shape and dimension. The method relies upon predictable factors that have been established by the inventors that, based upon the particular metal droplet, size of droplet, length of contact, and other factors, predictably result in a predetermined nanostructure.

The invention also provides a method for the parallel formation of array of nanoneedles. In a preferred method of the invention, predetermined sized droplets are delivered by channels to reservoirs that are aligned with an array of microscopic tips, such as AFM tips, micropillar, etc. The tips are contacted with the droplets and drawn away from the droplets in a controlled and predetermined fashion to draw an array of nanoneedles at predetermined locations and in a predetermined orientation that is determined by the direction of pulling. The nanoneedles exhibit excellent flexibility, and also exhibit strong attachment.

A preferred method of the invention uses constant diameter and very long nanoneedles, e.g., several microns long, to conduct general liquid and/or visco-elastic testing. The very long nanoneedle provides clearly distinct entrance and exit resistance measurements, from which precise elasticity, viscosity, surface tension, and other significant properties of the liquid or viscoelastic substance being tested can be determined. Additional methods of the invention measure the properties of living cells. Cells have been shown to attach to nanoneedles of the invention upon penetration of the nanoneedles.

Additional embodiments include nanostructures formed from nanoporous materials. An embodiment of the invention for forming porous nanostructures forms the nanostructures, either individually or in a predetermined array at predetermined locations, coats the nanostructures, and conducts material removal, such as by etching, to remove the coating and produce pores in the underlying nanostructure.

Particular embodiment nanostructures, including nanoneedles, are tipped with another material. The tip material is a metallic material in preferred embodiments. Another preferred embodiment is a plurality of nanoneedles formed at precise locations and with distal ends that converge. The converging distal ends form nanotweezers. Preferred devices of the invention are micromechanical sensors, including those based upon atomic force microscopy and MEMs devices. Particular example sensor applications are devices including nanostructures configured to measure material mechanical properties, including stress, dimensions, stiffness, elasticity, evaporation rate, etc. Electrochemical properties can also be measured with nanostructures, including for example, properties of living cells.

A preferred method of the invention attaches complex molecules, e.g., DNA, proteins, fibrins, peptides, etc., to the end of a cantilevered nanostructure. Properties of the attached complex molecule can be analyzed. Additionally, the complex molecule can be precisely positioned or moved for examination or reaction of other molecule of sub-cellular level.

Preferred methods of the invention make use of constant diameter nanoneedles of the invention. One preferred method measures liquid thin film depth. A constant diameter nanoneedle on an AFM tip is dipped in liquid and the force spectrum is recorded.

Another application for the constant diameter nanoneedles is to measure properties of polymer nanofibers. The constant diameter nanoneedles provide clear information on the length and diameter of fibers as the fiber is pulled, permitting real-time, interactive determinations of nanofiber dimensions and as the fibers are drawn and patterned. This provides a powerful method for the accurate fabrication of three dimensional nano and microdevices, for example. Similarly, nanoneedles can be used as a force sensor to manipulate and study other nanostructures and their mechanical properties.

Nanoneedles can also provide information about the mechanical properties of individual live cells, such as viscoelastic and stiffness properties. Insulated nanoneedles of a preferred embodiment can be used as an electrode that can be injected inside a living cell to study electrochemical properties of the cell without killing the cell. Nanoneedles can be used to locally grow or collect proteins. More generally, nanostructures of the invention can be used as a growth or study platform/scaffold to grow various nanostructures and to study.

Nanostructures, including insulated and superporous structures and their methods of fabrication form embodiments of the invention. Such structures and the above general methods have a wide range of specific applications in different industries, as will be recognized by artisans. Examples include the use of micro- and nano-structures to form precision nano-blades for nano-surgery and AFM tips for vertical imaging or for magnetic force microscopy. Superporous metal nanostructures are useful as gas sensors, electrochemical sensors, as electrodes, and in hydrogen capacitors. Fast evaluation, characterization and quality control of liquid properties, including chemicals and biological fluids. Lubricants, coatings, polymers, etc. can be evaluated during fabrication. Polymer fibers can be formed from liquid and evaluated during fabrication Specific example structures of the invention include nanostructures in the form of plates, rods, cubes, needles, etc., formed by the self-assembly reactions of two or more metals. Structures can be formed in by the self assembly process at or near room temperature. Superporus metal nanostructures are formed in a preferred embodiment method by reaction of liquid metal with a secondary metal thin film, e.g., Pt, Cu, Pd, Ag, Au followed by selectively etching the liquid metal. In preferred embodiments, the liquid metal is Gallium, Ga, which permits processing at room temperature. Other metals that can be maintained as liquid droplets can also be used in the alloy reaction to form nanostructures. The specific example embodiments that will be discussed below are preferred embodiments using Ga. Ga is preferred for its room temperature processing ability and other characteristics, but other materials can also be used.

An insulated electrode is formed from a nanoneedle tipped device in preferred embodiment methods of fabrication. A preferred method makes a hollow probe through polymer coating and selective etching of a nanoneedle, or by decomposition of one block of a block copolymer making a porous coaxial probe.

Embodiments of the invention include methods for forming polymer, fibrin, protein, and nanomaterial-polymer composite nanofibers by using the metal needles to pull nanofibers of predictable dimensions using specific rheological principles.

Embodiments of the invention include polymerizing nanofibers from monomers and oligimers using the needles as templates and AFM-needle combination as detection mechanism of the polymerization process e.g, with peptides, short proteins and non-natural polymers as well.

An embodiment of the invention uses brushing on nanomaterial-polymer composite fibers to self-assemble nanofibers air bridges. Another embodiment of the invention uses decomposition of polymer, in polymer air bridges to form nanomaterial air bridges A preferred method for making a nanoelectrode on a needle includes forming a. needle on an AFM, insulating the needle, opening the insulation at the tip, and exchange or overcoating to make the tip a desirable electrochemical anode or cathode material.

Methods of the invention provide compressional measurements using long needles as force sensors. This is significantly different from measurements in tension—as most nanomaterials used for compressional measurements yield, fracture or, in the case of nanotubes, crumple in compression measurements. The needles compress over a long range with a long range of continuously increasing forces. High order buckling modes can be entered and recovered from without breaking the needles.

The invention provides methods for metallic nanostructures self-assembly and materials testing. Preferred embodiment methods permit for the formation of individual nanostructures and arrays of nanostructures. The nanostructures formed can have a metal alloy crystal structure. Example structures include slender wires, rectangular bars, or plate-like structures. Tips can be shaped, single layer and multiple layer coatings can be formed, tips can be functionalized, molecules can be adhered, and many testing methods are enabled.

In preferred methods of the invention, formed nanostructures are coated with an insulated layer, such as a polymer. In an example embodiment, the nanostructure is a nanoneedle and the polymer is then removed polymer from a tip of the nanoneedle by via side-to-side flexing during contact mode scanning of a deep and narrow trench in an atomic force microscope (AFM). In preferred embodiments, a nanoneedles is coated with alternating layers of insulator and metal. Removing the layers from the tip of the nanoneedle creates a multiconductor nanoelectrode.

Preferred embodiment nanoneedles include sharpened tips. A preferred step of sharpening a tip of the nanoneedle is conducted by vibrating the nanoneedle against a surface. Another preferred method of sharpening a tip of the nanoneedle is by selectively etching the end of the needle into an etchant forming a meniscus between the needle tip and the etchant.

In preferred nanoneedle formation methods, opposing nanoneedles are formed. The opposing nanoneedles are electrically connected to a contact to form electrostatically actuated nanogrippers.

In preferred method for biomolecular separation, an array of nanoneedles is contacted with a plurality of liquid metal droplets. The formed nanoneedle array is dipped into a liquid including a mixture of molecules. Voltage is applied to each individual nanoneedle, which are dipped into individual dishes. Voltage is applied to deposit molecules.

In a preferred method of using nanoneedles for measurement of the rheological properties of liquid, a nanoneedle is contacted to the liquid. Properties related to the contact of the nanoneedle with the liquid are measured and rheological properties of the liquid are calculated.

In a preferred method of forming metal pores, metal alloy nanostructures are formed. Selectively removal of a metal forms pores in the nanostructure.

In a preferred method for forming polymer fibers, a nanoneedle tip having a substantially constant diameter is used to draw a polymer fiber from a polymer droplet. The polymer fiber is drawn to another droplet. The polymer fiber is permitted to solidify into one or a plurality of suspended air bridges and suspended arrays.

In a preferred method for forming nanofiber air bridges, a liquid polymer is brushed with dispersed nanomaterials over a plurality of micropillars. The solution is permitted to solidify into a nanomaterials-polymer composite. The polymer is decomposed to form nanomaterial air bridges Preferred embodiments of the invention will now be discussed with respect to the drawings. The drawings may include schematic representations, which will be understood by artisans in view of the general knowledge in the art and the description that follows. Features may be exaggerated in the drawings for emphasis, and features may not be to scale.

Selective Nanowire/Nanoneedle Fabrication and Arrays

Substantially constant diameter single nanowires/nanoneedles and arrays of nanowires/nanoneedles are example self-assembled nanostructures that can be formed. FIGS. 1A-1D illustrate a preferred method for the formation of a single nanowire/nanoneedle at a particular location and with a particular orientation. The FIGS. 1A-1D method can be extended to form arrays of nanowires/nanoneedles, hereafter referred to as nanoneedles.

With reference to FIGS. 1A-1D, an AFM cantilever 10 with a tip 12 is coated with a metal 14. An example metal is Ag. The cantilever 10 is positioned, such as with a micromanipulator, over a metal droplet 16 that will form an allow with the metal 14. Temperature and pressure conditions are maintained to promote an alloy forming reaction. If the metal 14 is Ag and the metal droplet 16 is Ga, as in a preferred embodiment, room temperature and atmospheric pressure promote the alloy reaction.

The coated tip 12 is lowered into the droplet 16 and metal solute 18, e.g., Ag solute, forms around the tip 12. The tip is withdrawn (FIG. 1C) to form a meniscus 20. The direction of pulling (and the corresponding direction of the meniscus 20) determines the orientation of nanoneedles that will form. Alloy nanoneedles 22 self-assemble around the tip 12, but upon retraction from the droplet 20, a single nanoneedle 22a extends at the predetermined orientation. The creation of the meniscus 20 strongly favors growth of a single needle, and also provides a basis to control the orientation of the needle. The duration of immersion determines needle length, while the direction of pulling (and the meniscus 20) determines the needle orientation. The droplet 16 is on a suitable substrate. An underlayer, such as 10 nm chrome underlayer on the tip 12 and on the substrate can be used to improve metal adhesion to the cantilever 10.

In a preferred embodiment, an Ag coated AFM tip (or an array of tips) is placed over a melted Ga droplet (or an array of droplets) at a predetermined position(s). The Ag coating can be by sputter coating, for example. The needle tip of the probe is inserted into the droplet(s) and is retracted to make a meniscus. While a plurality of needles form, a single constant diameter nanowire oriented with the meniscus forms when the cantilever is withdrawn. In experiments, $Ag_2Ga$ needles as narrow as 25 nm have been made. The ability to fabricate the needles (and other nanostructures) at room temperature, in air, greatly simplifies the production method. Tipped and tipless cantilevers positioned with micromanipulators can be used in preferred methods. Any native Ga oxide formed over the Ga in air is around 1 nanometer thickness and easily penetrated by the Ag-coated cantilever and does not inhibit the reaction of Ga with the Ag film.

Arrays of Free-Standing Nanoneedles

The invention also provides parallel growth of individual freestanding nanoneedles, such as $Ag_2Ga$ nanoneedles at the end of an array of microcantilevers or micropillars. Self-assembly of Ag2Ga nanoneedles from the reaction of a liquid Ga and Ag thin film is accomplished.

FIGS. 2A-2D illustrate a preferred method for parallel fabrication of an array of free-standing nanoneedles with a controlled orientation and location. In the method, microchannels 26 formed in a substrate 28, e.g., silicon, deliver liquid metal 16 (such as gallium) in droplet forms at the top of microchannels 26 to predetermined locations. An array of AFM cantilevers 10 prepared as in FIGS. 1A-1D conducts the sequence of steps as in FIGS. 1A-1D to form an array of nanoneedles oriented in the direction of pulling.

In both FIGS. 1 and 2, when preferred $Ag_2Ga$ needles form from an Ag coated AFM tip (or tipless AFM or micropillar), the self-assembly formation takes place in a few seconds. Pulling back the cantilever or cantilever array from the Ga drops, leaves single freestanding nanoneedles in an array that extend form at the end of each cantilever (or pillar), and the needles are oriented in the direction of pulling. The freestanding nanoneedles can be used as ultra sensitive nanocantilevers for several other applications.

Nanocapillaries

Figure 3A:
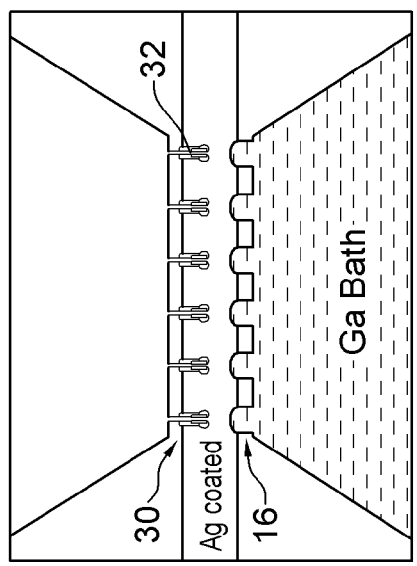
FIGS. 3A-3E illustrate a preferred method for forming nanocapillaries.
Figure 3B:
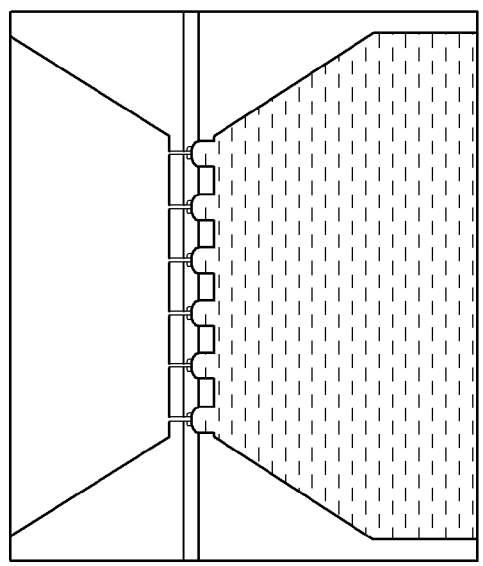
Figure 3C:
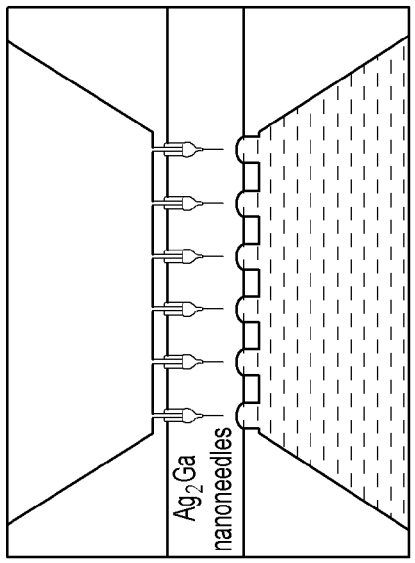
Figure 3D:
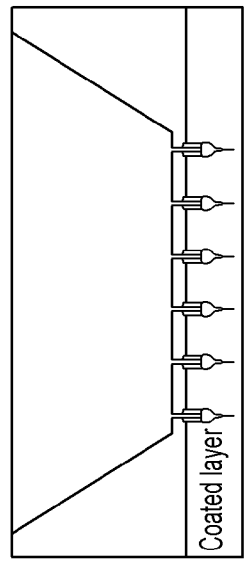
Figure 3E:
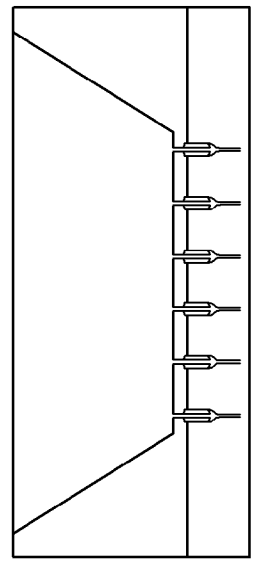

FIGS. 3A-3E illustrate a preferred method for forming freestanding nanocapillaries on the end of microcapillaries. This example is again illustrated with Ag and Ga, while other metals can be used to form other alloys. In FIG. 3A an Ag coated microcapillary array 30 with microcapillaries formed on pillars 32 is brought to contact with an array of Ga droplets 16, which can be positioned via microcapillaries as in FIG. 2. In FIG. 3B, the array 30 is partially dipped inside the Ga droplets 16. Pulling back the array 30 in FIG. 3C, causes freestanding $Ag_2Ga$ nanoneedles 34 to be self-assembled on the pillars 32 of the array 30. In FIG. 3D, nanoneedle array is coated with a secondary layer 36 (e.g. polymer, glass, etc). In FIG. 3E, the metallic nanoneedles are etched away and freestanding nanocapillaries 38 are fabricated that are made of the secondary coating layer.

Nanogrippers

FIGS. 4A-4E illustrate a preferred embodiment process for the formation of nanogrippers or nanotweezers. In FIG. 4A, dual micropillars 40 that have been microfabricated at the end of microcantilevers 10 each include a separate electric contact 42, such as a metal trace. In FIG. 4B, the pillars 40 are selectively Ag coated with a shadow masking technique so that patterned Ag is formed at a desired location 44. In FIG. 4C, the pillars 40 are then brought to contact with a Ga droplet 16 and are partially dipped inside the Ga droplet 16. In FIG. 4D, during the retraction of the cantilever from the Ga droplet 16, two $Ag_2Ga$ nanoneedles 46 are self-assembled, one on each pillar 40. The needles will form parallel to the pillars wall and along the Ag pattern. The wall of the pillar can therefore control the orientation, and angle the two needles 46 toward each other. In FIG. 3E, the needles 46 are processed, such as by etching, cutting, etc. to make the needles longitudinally equal. The Ag is patterned such that the needles 46 make electrical contact with the contacts 42. By applying AC voltage through the contacts 42 with a frequency close to the resonance frequency of nanoneedles 46, the device, through electrostatic attraction will be able to open and close thereby making it useful as a as a gripper or nanotweezer.

Selective Growth of $Ga_6Pt$ Nanoblades

Plates/blades can be crystallized in droplet of gallium, and their tapered edges can be used as cutting tool. A method for forming nanoblades involves using a platinum coating on the tip 12 instead of the silver coating. With the platinum coating, nanoblades (instead of nanoneedles) form via self assembly. The blades grow from the tip of the cantilever directed along the long axis of the Ga meniscus.

Ga Based Self-Assembly

Figure 5:
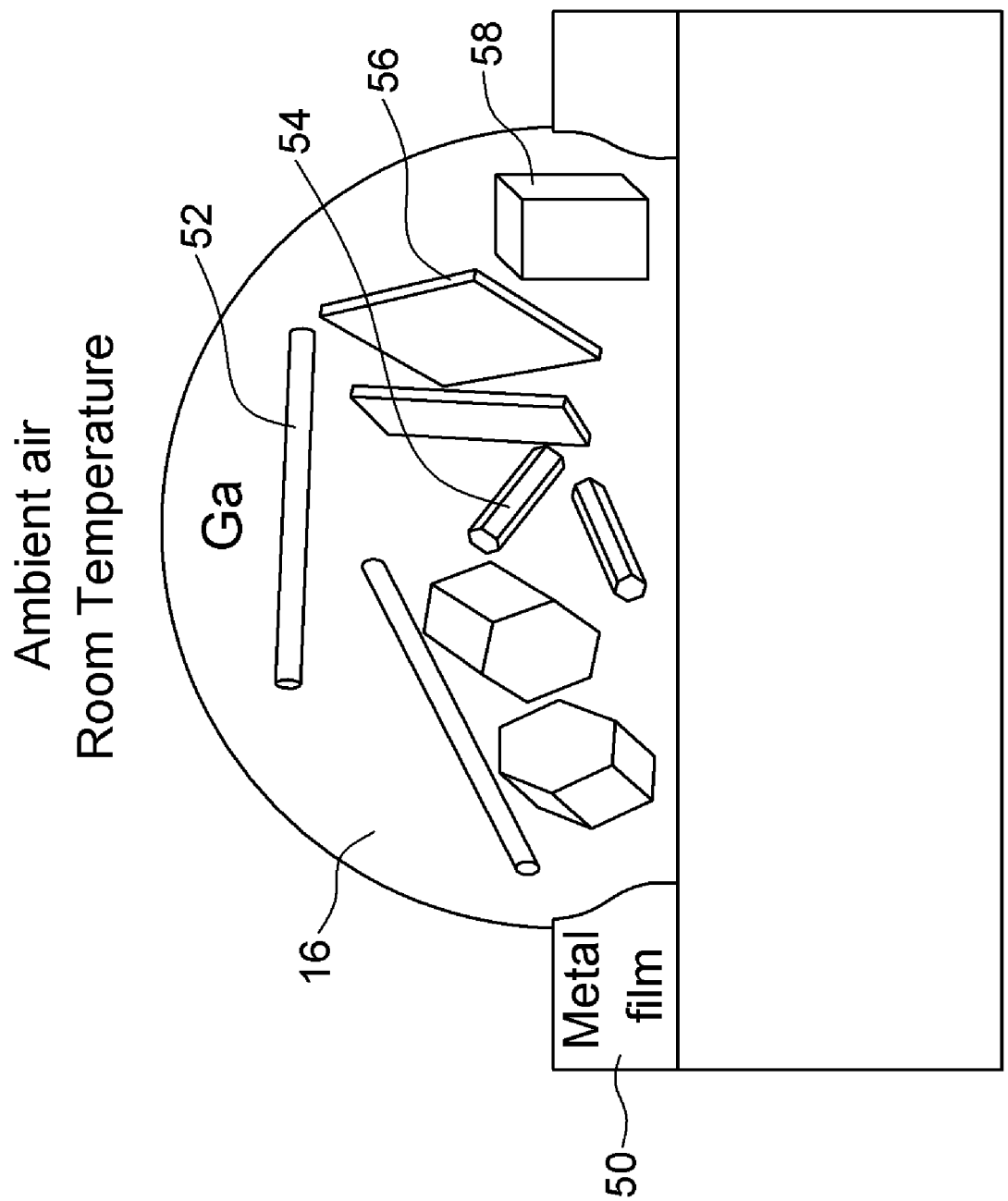
FIG. 5 illustrates a preferred method for nanostructure formation.

Ga reacts with a number of metals at room temperature. As Shown in FIG. 5, Ga reacts with metal film 50 at room temperature and dissolve the metal film to form nanostructures (e.g. needles 52, rods 54, plates 56, cubes 58, etc). Though Ga melts within a few degrees of room temperature, it alloys to produce solid compounds that melt well above room temperature. Ga is used in preferred self-assembly processes in the formation of metal alloy nanostructures. Experiments have been conducted for many types of Ga based self-assemblies and will now be discussed along with preferred testing methods and applications. Artisans will appreciate broader aspects and additional embodiments of the invention from the discussion of the preferred embodiments.

The experiments provide information about the self-assembly behavior of Ga alloys. The performance of nanoneedles and other structures that can be used for a number of important applications is also discussed.

Ga Alloy Nanostructures

2 μm to 1 mm diameter drops of Ga 16 (99.9% purity from Alfa Aesar) are contacted with sputter deposited metal thin films 50 or foils of Au (99.9%), Ag (99.998%), Pt (99.99%), Pd (99.95%), and Co (99.95% purity) all from Alfa Aesar. The thin films are between 20 nm and 350 nm and the foils are between 25 μm and 125 μm in thickness. Ga is left in contact with the foil from 10 minutes to 24 hours. In some cases, the Ga is not completely reacted with the film. The excess Ga is removed by etching the sample in 1 N HCL at 60° C. for 5 to 10 minutes. Each material combination produces unique crystal morphologies (as was revealed by SEM images) and in each experiment, structures of nanoscale dimensions are formed.

Ga-M Predictive Conditions for Selective Nanostructure Growth

A number of Ga-M (Ga-Metal) phase diagrams were examined. The lowest temperature invariant line and the associated intermediate phase are reported in Table 1. Of the 31 phase diagrams examined, 20 have an invariant line at temperature of 34° C. or lower. Of course, even if an alloy is shown on the phase diagram, it may not form in a reasonable time. To further study the reasonableness of the hypothesis, Ga drops were reacted at room temperature with a number of elemental metals. Table 1 shows that a number of materials do form crystals. Ga—Al was also studied. It readily alloys with Ga, but rather than forming crystals it forms an amorphous alloy. Also note that some of the metals do not react with Ga at room temperature, and in fact, the invariant temperature can be very high (e.g. Ga—Ti, Ga—W). These metals prove useful both as barrier materials to prevent the Ga reaction and as adhesion promoters that improve the wetting of Ga to substrates (e.g. Si and $SiO_2$ for which Ga barely wets.)

TABLE 1

Prediction and measurement of intermediate phase formation at room temperature in several Ga-M systems.

| | | Characteristic from phase diagrams | | Experimental observations by author | |
|---|---|---|---|---|---|
| Element | Symbol | Ordered phase for the lowest temperature liquid Ga-ordered phase-invariant line | Temperature of the invariant line (° C.) | Are Ga-M crystallites observed at room temperature? | Atomic ratios of observed crystallites by EDS (Ga:M) |
| Aluminum | Al | None | N/A | No | — |
| Cadmium | Cd | None | N/A | | |
| Chromium | Cr | $CrGa_4$ | 29.5 | No | — |
| Copper | Cu | $CuGa_2$ | 29 | Yes | 2:1 |
| Cobalt | Co | $CoGa_3$ | 30.5 | Yes | 1:2 |
| Gold | Au | $AuGa_2$ | 29 | Yes | 2:1 |
| Hafnium | Hf | $Ga_3Hf$ | 29 | | |
| Indium | In | $Ga_{14.2}In_{85.8}$ | 15.3 | | |
| Iron | Fe | $FeGa_3$ | 34 | | |
| Manganese | Mn | $Ga_6Mn$ | 29 | | |
| Molybdenum | Mo | $GaMo_3$ | 1108 | | |
| Mercury | Hg | None | N/A | | |
| Nickel | Ni | $Ga_4Ni$ | 29.2 | | |
| Niobium | Nb | $Ga_3Nb$ | 29.2 | | |
| Osmium | Os | * | * | | |
| Palladium | Pd | $Ga_5Pd$ | 29 | Yes | 5:1 |
| Platinum | Pt | $Ga_6Pt$ | 28 | Yes | 6:1 |
| Rhenium | Re | None | N/A | | |
| Rhodium | Rh | * | * | | |
| Ruthenium | Ru | * | * | | |
| Scandium | Sc | $Ga_3Sc$ | 29 | | |
| Silver | Ag | $Ag_2Ga$ | 28 | Yes | 1:2 |
| Tantalum | Ta | ** | ** | | |
| Tin | Sn | None | N/A | | |
| Thallium | Tl | None | N/A | | |

TABLE 1-continued

Prediction and measurement of intermediate phase formation at room temperature in several Ga-M systems.

| | | Characteristic from phase diagrams | | Experimental observations by author | |
|---|---|---|---|---|---|
| Element | Symbol | Ordered phase for the lowest temperature liquid Ga-ordered phase-invariant line | Temperature of the invariant line (° C.) | Are Ga-M crystallites observed at room temperature? | Atomic ratios of observed crystallites by EDS (Ga:M) |
| Titanium | Ti | ** | ** | No | — |
| Vanadium | V | $Ga_{41}V_8$ | 29.7 | | |
| Yttrium | Y | $Ga_2Y$ | 29.8 | | |
| Zinc | Zn | None | N/A | | |
| Zirconium | Zr | $Ga_3Zr$ | 860 | | |
| Tungsten | W | $Ga_5W_2$ | 2237 | No | — |

* No phase diagram exists. $Ga_3Os$, $Ga_2Os$, $Ga_3Ru$, $Ga_2Ru$, $GaRu$, $Ga_3Rh$, $Ga_{17}Rh_{10}$, $GaRh$, $GaRh_2$, are known ordered phases of Ga—Os, Ga—Ru and Ga—Rh respectively.
** Phase diagram is incomplete. $Ga_3Ta$, $Ga_2Ta_3$, $Ga_3Ta_5$, $Ga_3Ti$, $Ga_2Ti$, $Ga_5Ti_3$, $GaTi$, $Ga_4Ti_5$, $Ga_3Ti_5$ $GaTi_3$, are known ordered phases of Ga—Ta and Ga—Ti respectively.

The key experimental results reported in Table 1 can be summarized as follows. Thirty one Ga-M phase diagrams were examined. Twenty four of these systems have at least one intermediate phase. Seventeen of these diagrams have a two phase region of liquid and intermediate phase for which the Ga remains liquid near room temperature. Seven of these systems were experimentally studied to see if crystals form at room temperature. Six of the seven did form crystals. There appear to be at least nine more materials that are expected to form ordered phases at room temperature. A general conclusion is that there are many potential self-assemblies possible with Ga-M systems, not to mention the additional reactions possible at room temperature using m-ary systems or other low melting temperature metals (e.g. In, Hg, Bi, Sn).

The reactions are not limited to the immediate vicinity of an interface, and can extend for considerable distances as a spreading front. The action of continuous spreading can be viewed as a type of self-assembly. For thicker films of Au, Ga does spread by wetting, but the wetting front is preceded by the reaction front.

Reactive spreading from a Ga droplet on an various metal thin films can produce a variety of morphologies dependent on radial distance from the droplet. This non-planar front of Ga spreading is observed at temperatures well above room temperature (between 310° C. and 400° C.). Thus, reactive spreading through thin films appears well-matched to the processes used in microfabrication and planar lithography, and might offer some potentially interesting extensions to device fabrication.

Temperature Effects on Crystal Size for Pt, Ag, Pd, and Co with Ga $Ag_2Ga$ crystalline needles were formed that self-assemble at 200° C. and room temperature respectively. Larger diameter needles form at higher growth temperature. Plates of $Pt_6Ga$ self-assemble during the reaction of Ga with metal foil at 160° C. and room temperature. Larger structures are produced at the higher temperature. Further examples include the formation of Ga—Pd crystals and Co—Ga nanorods and follow the same temperature trend.

Ga-M (Gallium-metal) crystallites are ordered phases, as confirmed by X-ray diffraction (XRD), energy dispersive, spectroscopy (EDS), selective area diffraction (SAD) and high resolution, and transmission electron microscopy (HR-TEM).

Congruently melting solids are compounds that melt directly into a liquid of the same composition at their highest melting point are. Incongruently melting compounds produce liquid phases of differing compositions from the solid phase. An example of an incongruently melting solid is $Ga_6Pt$, which converts to liquid $Ga_6Pt$ and $Ga_7Pt3$ above 563 K.

Ga—Ag Reactions to Produce Individual Needle-Shaped Nanostructures at Selected Locations and with Selected Orientations Nanoneedles can also be self-assembled from a sputter-coated Ag thin film on a Si substrate. A thin film of Cr followed by a film of silver is sputter-coated on the Si substrate using a Technics sputtering system. Cr sputtering is performed using RF power of 300 W at 20 mbar operating pressure for 20 s to deposit 10 nm of Cr. Different thicknesses of Ag sputtered film (between 15 nm and 350 nm) are coated using DC power of 350 W at 20 mbar operating pressure. When a drop of Ga is placed on a thin film of Ag, needle-like structures rapidly form underneath the drop.

Patterning Ga on the Ag film is possible. A tungsten tip mounted on a micromanipulator is dipped into a pool of melted Ga until a small amount of Ga adheres to the tip. The hanging Ga droplet is brought towards the Ag film and dragged across the surface forming a Ga line from 10 to 100 µm wide and from 0.5 to 10 µm thick. In a few seconds, several alloy needles form parallel to the surface. Most of the needles nucleate near the edges and grow towards the center of the Ga line. This also was demonstrated with Ag foils.

Formation of Horizontal Needles

Horizontal needles were formed on Ag films of thickness from 15 to 305 nm. Ga remained visible around the needles even after several days. Ga dissolves the Ag so fast that the Ga droplet separates from the rest of the film, which stops it from spreading further. In thicker films, Ga reactively spreads through the surrounding Ag film, leaving behind nanoneedles that are free of Ga. The number of needles per unit area is strongly correlated with the thickness of the Ag film. The minimum diameter of the needles increases with the thickness of the film until the diameter saturates at around 100 nm. Also the number of the needles per unit area increases linearly with the thickness of the needles. With more Ag available in the thicker films, more needles are created.

Extra Ga surrounding needles was removed by applying 1 N HCl at a temperature between 25° C. and 60° C. Most of the Ga is removed without damaging the needle after a 20 minutes etch. The best etching condition to ensure smooth needles is at room temperature for no longer than 30 minutes.

Formation of Vertical Needles

When melted Ga is applied to a 125 µm silver foil, vertically oriented needles form. The Ga reaction can take 2 to 7 days before all of the Ga is depleted. It appears that Ga transport direction is primarily into the foil, rather than laterally, which suggests that needle growth is oriented with the direction of Ga flow. Repeating this experiment at a higher temperature (240° C.) results in the formation of thicker and shorter needles.

Meniscus Localized Pulling Growth of Needles

Growth can be localized to a thin meniscus of Ga. The meniscus is created by pulling the AFM tip away from the Ga droplet. AFM tips are sputter-coated with ~10 nm Cr film followed by an Ag film. The thickness of Ag films is usually between 50 to 200 nm with a preferred thickness of 100 nm. Small Ga spherical droplets are made on a Si substrate. First, a small amount of Ga (less than 1 mm diameter) is placed on the Si surface using a tungsten tip. Then the tip is scratched on the Si substrate until several micron wide lines of Ga are formed. Next the sample is dipped in 1 N HCl at 60° C. for 1 minute. The sample is then blown dry with nitrogen and immediately transferred into a SEM chamber. The droplets used to pull the needles, are usually smaller than 20 µm in diameter The AFM tips are manipulated using a nanomanipulator inside the SEM. Coarse mode manipulation is used while moving the cantilever close to the Ga droplet and fine mode (5 nm resolution) is used while dipping the tip inside the droplet. The silver coated AFM tip is dipped into the liquid Ga droplet and partially retracted from the droplet forming a meniscus between the cantilever and the droplet. Ga reacts with and dissolves the silver film, and nanoneedles form. Before the needle formation is complete, the cantilever is pulled further to narrow the meniscus. The needles continue to grow within the meniscus and towards the center of the Ga droplet with a single needle eventually extending past the others. The cantilever is completely retracted and separated from the droplet and a freshly grown needle is found attached to the cantilever. The total time of needle formation on the AFM tip ranges from 5 seconds to 10 minutes. The temperature inside the SEM chamber is usually room temperature. While this is below the melting point of Ga, the melted Ga remains in a liquid state during the process. The pressure inside the chamber is between $1 \times 10^{-5}$ torr to $5 \times 10^{-5}$ torr.

The needles can also be made without an SEM chamber. The needles have also been grown in ambient air using a M5 AFM in contact mode. In this set up, an Ag coated cantilever is positioned over a small Ga droplet. After engaging in contact mode, the cantilever is then (using the z axis step motor) pushed into the Ga droplet ~1 µm and pulled back ~1 µm to make the meniscus. The tip is held in this position for 2 to 10 minutes. Then it is pulled back and completely separated from the Ga droplet. A needle as small as 25 nm has been obtained by the localized meniscus pulling technique.

Also, the tip of the cantilever is not required to selectively grow the needles. A tipless cantilever coated with Ag can also be used.

Control Over Orientation and Length

The orientation of the needles can be controlled by appropriately orienting the cantilever with respect to the Ga droplet. The orientation of the needle is along the axis of the meniscus and the meniscus orients along the direction at which the substrate is retracted from the Ga. The non-normal orientation is a result of retracting the cantilever at an oblique angle from the surface of the Ga droplet. In a set of 15 identically prepared cantilevers 11 needles were grown in a direction of 12°±3° with respect to the normal to the apex of the tip.

The length of the freestanding needles can be also controlled by varying the time that the cantilever is immersed in the Ga droplet. The short needles shown are made in a few seconds while the longer needles shown in result when the end of the needles is kept inside the Ga droplet for several minutes (between 2 and 10 minutes).

The Effect of Voltage on Needle Formation

The effect of electric potential on the needle growth was tested. Voltages of +10 V and −10 V are applied from the nanomanipulator through the cantilever to the grounded Ga droplet. Preliminary observations show that with both positive and negative potential, the Ga more strongly wets the cantilever. Also, it is not necessary to push the tip inside the droplet. Instead, moving the AFM tip toward the Ga droplet attracts the Ga to the tip and also makes the meniscus more reproducibly attach to the cantilever. In addition, it has been found that the needles become thicker in diameter when using the voltage. Thus, applying the voltage at the beginning of the process (for a few seconds) and rapidly provides an approach to taper the needles. Also, applying voltage and measuring the current may provides a technique to monitor the process without the need for visual observation by SEM.

General Observations of Needle Formation

Several observations of the tip region during the needle formation are provided. Immediately after dipping the tip inside the Ga droplet, the Ag film completely dissolves away from the point of the tip up to the air/Ga/Ag triple point. The retraction of the tip forms a crevice shaped region between the Cr—Ga interface on one side, and the Ga-air interface on the other side, with Ag at the apex of the crevice. Since a crevice lowers the energy barrier to nucleation, the needles (from a few to many) originate from the apex. Several images taken of needle growth on the AFM tip, as well as on the Ag film support the hypothesis that the needles originate from the edge of Ag film. As the needles lengthen, they can grow into each other forming a bundle. Then the bundle tapers down to a single needle that continues to grow toward the center of the Ga droplet. Most of the needle ends have a cylindrically curved incoherent edge.

In most of the experiments with AFM tips as well as with needle formation on Ag foil and thin films, stepwise tapering is seen. This is observed as eventually one needle growing past all the others resulting in a constant diameter needle from this point. Needles of constant diameter over at least 12 microns have been made to date. Tapering could be related to the reduction of available solute and the instability of the system in maintaining the planar fronts. In other words, more Ag will diffuse into a sharper surface, enhancing the growth rate of a single needle verses a flat bundle.

Experiments as described above have demonstrated that $Ag_2Ga$ needles can be directed to self-assemble at desired locations and with desired orientations. They grow by a nucleation process. Temperature and voltage control provide control of the length, diameter, and taper of the needles.

Resonance Frequency of Nanoneedles

Because long $Ag_2Ga$ nanoneedles can be grown directly on AFM cantilevers, or any other micromechanical platform, it is possible to directly measure their mechanical properties. Measurements are consistent. From these measurements it is possible to determine Young's modulus E of $Ag_2Ga$ materials, the Hamaker constant A between $Ag_2Ga$ and the Si, the frictional coefficient $\mu_k$ between $Ag_2Ga$ and Si, the mechanical resonance frequency $f_n$, quality factor Q, and spring constant k of the needles.

The elastic properties of the needles are studied by observing the deflection of individual needles attached to AFM cantilevers. Several measurements methods are used and the results are compared against each other to demonstrate the accuracy of the data. SEM together with a nanomanipulator and AFM are the principal instruments used in these measurements. Deflections of the needles are viewed inside the SEM. An AC voltage is applied between the needle and an electrode connected to a nanomanipulator arm. The electrode is brought close to the free end of the needle. The frequency of the AC voltage is then varied until the deflection of the needle is maximum. This frequency is considered to be the resonance frequency of the needle. From the resonance frequency and information about the length and diameter of the needle, and the density of the material, Young's modulus of the material can be calculated.

The needle-tipped cantilevers are mounted in an AFM. The needles are pressed against a hard, negligible deforming surface such as silicon. The AFM records the deflection of the cantilever as a function of applied force. The resulting plot is referred to as a force-distance (F-D) curve. In these studies force and torque from a needle produces cantilever deflections that are recorded as force in the F-D curve. The F-D curves provide data from which can be determined spring constant, Young's modulus of $Ag_2Ga$, Hamaker constant between $Ag_2Ga$ and Si in air, the frictional constant of $Ag_2Ga$, and the spring constants of needles in specific buckling modes.

The resonance frequency of the needle corresponds to the frequency at which the deflection of the needle is maximized and the bandwidth B corresponds to the FWHM of the resonance.

A 14 μm long nanoneedle with an average diameter of 98 nm was grown on a Veeco ULCM-B cantilever. Using AC voltage excitation, the resonance frequency of the needle was measured to be 255 kHz.

TABLE 2

LIST OF THE NEEDLE-TIPPED CANTILEVERS USED FOR AFM TOPOGRAPHY AND LITHOGRAPHY

| Tip # | Cantilever model | Cantilever resonance frequency (kHz) | Spring constant (N/m) | Needle diameter (nm) | Needle length (μm) |
|---|---|---|---|---|---|
| #1 | Veeco ULNM-D | 354.7 | 50 | 120 | 5 |
| #2 | Veeco ULCM-NTNM-B | 78 | 1.1 | 200 | 4 |
| #3 | Veeco ULCM-NTNM-B | 78.1 | 1.1 | 120 | 2 |
| #4 | Veeco ULCM-NTNM-D | 155 | 5 | 60 | 2 |
| #5 | Veeco ULNM-B | 78 | 3.2 | N/A | N/A |
| #6 | Budget Sensor BA-Tab300 | 315 | 45 | 90 | 5 |

Nanoneedles as Nano-Cantilevers & Mechanical Sensors

Nanoneedles can be used as cantilevers and mechanical sensors. In an experiment a nanoneedle on an AFM tip is positioned 1 μm from a surface to be tested, and if the tip does not make contact with the surface, the tip is lowered slightly and the process is repeated until the needle touches the surface and a reasonable force curve is observed. The scan is repeated until the force curve can be retraced several times. Then the curve is recorded. SEM images before and after the measurement confirm that the needle is unchanged by the AFM experiment.

TABLE 3

SUMMARIZES MECHANICAL PARAMETERS OF SAMPLE 1 BEFORE AND AFTER THE ADDING THE NEEDLE.

| | | Sample 1 | |
|---|---|---|---|
| Parameters | Symbol | Before adding needle | After adding needle |
| Nanoneedle length (μm) | L | — | 11.86 |
| Average nanoneedle radius (nm) | R | — | 75 |
| Resonance frequency of the nanoneedle (kHz) | $f_0$ | — | 421.0 |
| Angle between the needle and the surface (Degrees) | | — | 20 |
| Model of AFM cantilever | | Budget sensor BS-Tap 300 | — |
| Resonance frequency of the AFM cantilever (kHz) | $f_{0c}$ | 293.27 | 293.2 |
| Spring constant of cantilever after Ag sputtering (N/m) | $k_c$ | 10 | 9.83 |
| Spring constant of needle and cantilever when both are in contact with the surface (N/m) | $k_{T1}$ | — | 9.83 |
| Spring constant of needle and cantilever when only needle is in contact with the surface (mN/m) | $k_{T2}$ | — | 37 |
| The spring constant of the needle (mN/m) | $k_n$ | — | 33 |
| Young's modulus of the needle (GPa) | E | — | 71.2 |

Freestanding Nanoneedles as a Mass Balance

The resonance frequency of the $Ag_2Ga$ nanoneedles can be detectably sensed with mass loading as small as $10^{-20}$ kg. Decreasing the mass of the needle, and increasing the Q increases sensitivity. The highest Q measured experimentally for the $Ag_2Ga$ needles is 3300. For a density of 8960 kg/m3 the needle would have a mass of $1.51 \times 10^{-16}$ kg. This provides a mass sensitivity of $2.2 \times 10^{-20}$ kg. The needle sensitivity depends on its use on a vacuum. At standard pressure air damping can dramatically lower the Q, thereby reducing sensitivity. A needle with a uniform diameter and a total mass of m, the first resonance frequency is $$f_0 = \frac{1}{2\pi} \sqrt{\frac{k_n}{0.243m}}.$$

With a load of mass M at the end of the needle, the equation becomes $$f_M = \frac{1}{2\pi} \sqrt{\frac{k_n}{0.243m + M}}.$$

The minimum detectable shift in the resonance frequency is considered to be the bandwidth B of the resonance $$B = \frac{f_0}{Q} = f_0 - f_M$$

Eliminate $f_M$ gives a minimum detectable mass of $$M_{min} = \frac{0.243m\left[\frac{2}{Q} - \frac{1}{Q^2}\right]}{\left[1 - \frac{2}{Q} + \frac{1}{Q^2}\right]}.$$

For $Q \gg 1$ the term $1/Q^2$ can be neglected and the minimum detectable mass will be $$M_{min} \approx 0.243m\left(\frac{2}{Q-2}\right)$$

This equation shows that decreasing the mass of the needle, and increasing the Q increases sensitivity.

Sharpened Nanoneedle Tips

Figure 6:
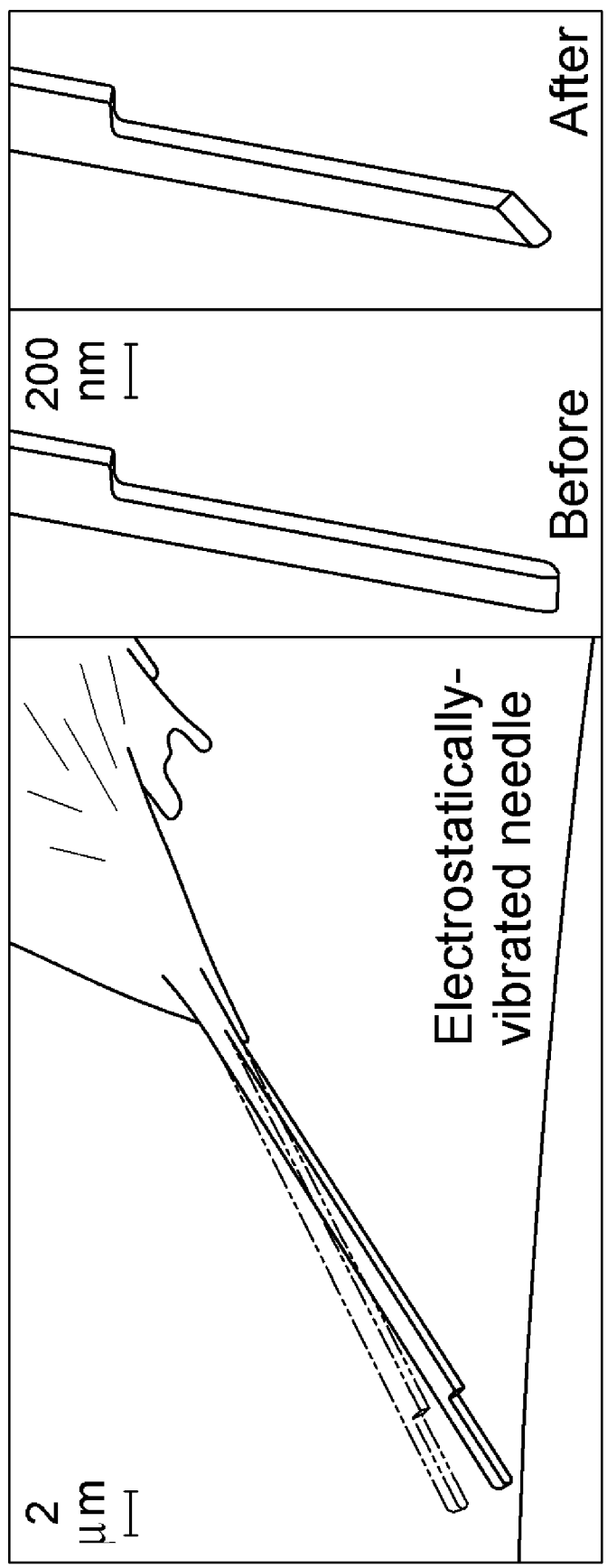
FIG. 6 includes images showing needles being vibrated and sharpened in this fashion, and before and after images of the tip of the needle.

Localized melting such as by placing an appropriate current density through the initially sharp tip can be used to shape the tip of a formed nanoneedle. Also, tips can be reshaped by an electrostatically driven collision of a needle with an electrode, which can be insulated. FIG. 6 includes images showing needles being vibrated and sharpened in this fashion, and before and after images of the tip of the needle.

Coating a Nanoneedle Tip

Once a high-aspect ratio tip is fabricated, it can be conformally coated with other materials that. For example, FIGS. 7A and 7B illustrate the polymer coating 70 of a nanoneedle 72. As an example, Parylene C can be vapor-deposited to produce a very thin conformal coating. As an example, a deposit of 10-100 nm of parylene using an SCS Cookson depositor has been conducted. SEM images showed a resultant parylene-coated needle with a 40 nm coating. An alternative coating method has been demonstrated in which the needle is dipped into a liquid coating of a specified viscosity and withdrawn at a specified rate resulting in a coating of a specified thickness through the physical process referred to as forced wetting. The liquid if filled with polymer solidifies to form a polymer coating.

Polymer Coated Nanoneedles and Nanoneedles with Exposed Tips

A needle or an array of needles formed by the invention is coated readily with polymers, such as parylene, which can be evaporated onto a formed nanoneedle in an evaporation chamber as described with respect to FIGS. 7A and 7B. As an example, parylene C has been vapor deposited in thicknesses of about 10 mm onto an $Ag_2Ga$ nanoneedle.

Additionally, the tips of polymer coated nanoneedles can be modified to create an insulated nanoneedle with an exposed tip, as seen in FIG. 7C (details of which are found in FIGS. 7E-7G) and 7D. Also, the tip can be made to be porous to provide a porous electrode. In FIGS. 7C and E-G, the tip of the polymer coating 70 is removed to expose an end of the nanoneedle 74. In FIG. 7D a porous metal 76 is formed on the tip of the exposed nanoneedle tip via an exchange process.

Example methods for opening the tip include selective melting, such as by current application, selectively etching the parylene by dip coating the end of the needle on parylene etchant and mechanical breaking of the tip. Tips of the polymer coated nanoneedles can be controllably snapped via side-to-side flexing during contact mode scanning of a deep and narrow trench 77 by AFM scanning (FIGS. 7E-G. The depth and the width of the trench 77 control the point at which the needle is snapped. A typical exposed area is approximately 100 to 400 nm in diameter surrounded by a 10 to 100 nm wide parylene ring.

Once the nanowire is exposed, it can be exchanged with a noble metal such as Pt using galvanic displacement. Pt can then be made porous by removing Ga from the resulting alloy in a mild HCl etch. Superporous Pt can also be formed by the procedures discussed above.

The resistance of an open ended needle with a 20 nm parylene sidewall coating) was only about 25% more resistive than a silver coated cantilever (with no parylene coating) and (2) that the same needle when fully coated in parylene was 100 times more resistive than with the end opened. These points at least suggest that mechanical contact can be made with the end of the needles and that the parylene is providing a significant degree of insulation.

The open-end of the of the nanoneedle probe can also have alternate modifications, such as with enzymes or with ion selective films to indirectly measure molecules such as glucose or cholesterol to or to monitor specific ions. Probing could be performed on cells immobilized on substrates and the electrode would be placed inside the cell using a micromanipulator under an imaging system e.g. as an optical microscope or extreme variable pressure SEM. The electrode could then be biased in a buffered aqueous solution versus a reference electrode at a potential appropriate to monitor the current from an electroactive molecule or ion of interest.

Multiconductor Nanoelectrodes

Figure 8A:
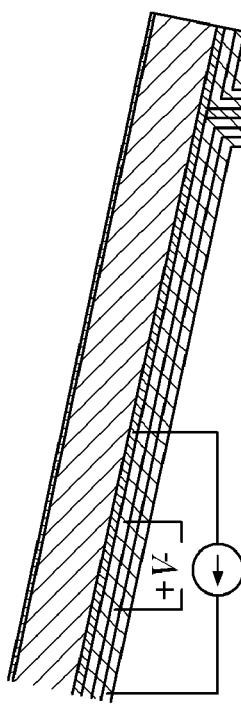
FIGS. 8A-8C illustrate a preferred embodiment method for forming multiconductor nanoelectrodes.
Figure 8B:
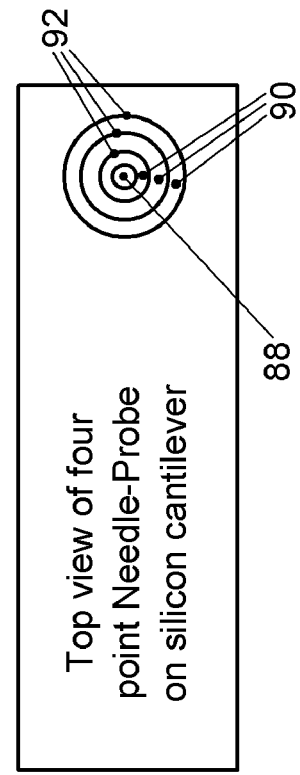
Figure 8C:
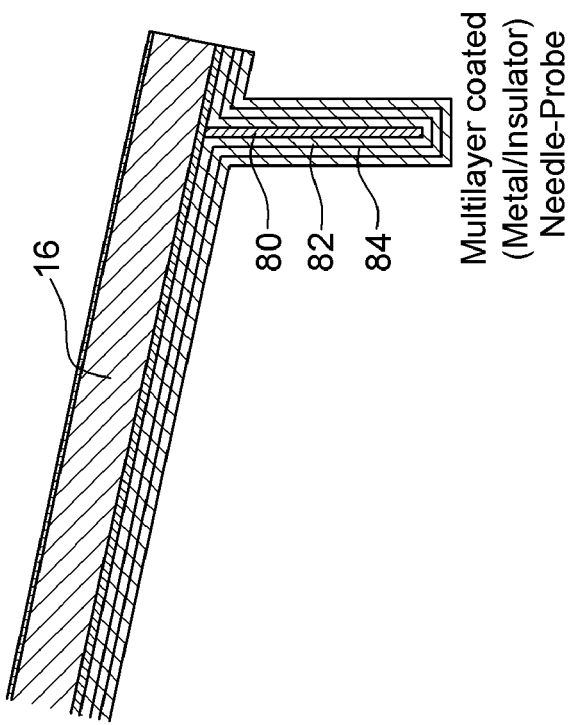

FIG. 8A to 8C shows a needle 80 or an array of needles formed by the invention on AFM cantilevers 16 that are coated with double layers of insulator 82 (e.g. Parylene) and metal alloy 84 (e.g. $Ag_2Ga$) (FIG. 8A). The end of the needles 86 are then exposed (FIG. 8B) by an FIB (focused ion beam) cut or by mechanically breaking the needles resulting a disk nanoelectrode 88 (sub 100 nm in diameter) surrounded by three ring electrodes 90 that layers of parylene 92 electrically insulate them from each other (FIG. 8C). With this approach, one can control the disk electrode spacing, which can be as close as 20 nm, which is the limit for the electric leakage in the parylene film. This multilayer coaxial design has the dual advantage of very small electrode spacing and the elimination of fringing fields which can reduce the resolution of electrical field scanning measurements with the electrodes. {Comment: Note that the term triaxial. Quadaxial means parallel conductors, not concentric conductors. Co-axial implies concentric conductors however, whether dual or multiple layers}

Polymer Fiber Drawing

Polymers dissolved in volatile solvents can be simultaneously formed into fibers, adhered to solid supports, and interconnected in real-time to create suspended fiber bridges and networks of specified geometries. This process can be conducted with a nanoneedle on an AFM tip or can be conducted with an AFM tip or tipless AFM.

Figure 9A:
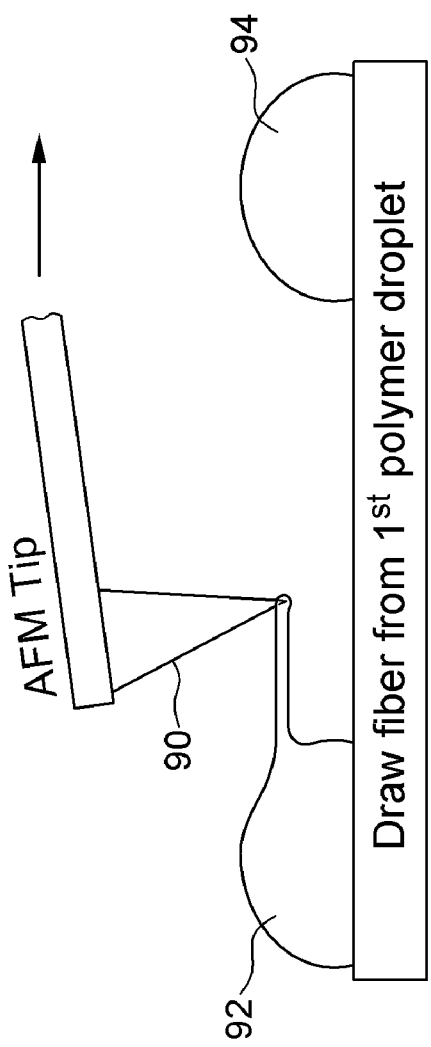
FIGS. 9A-9B illustrate a preferred embodiment method for forming suspended polymer nanofibers air bridges.
Figure 9B:
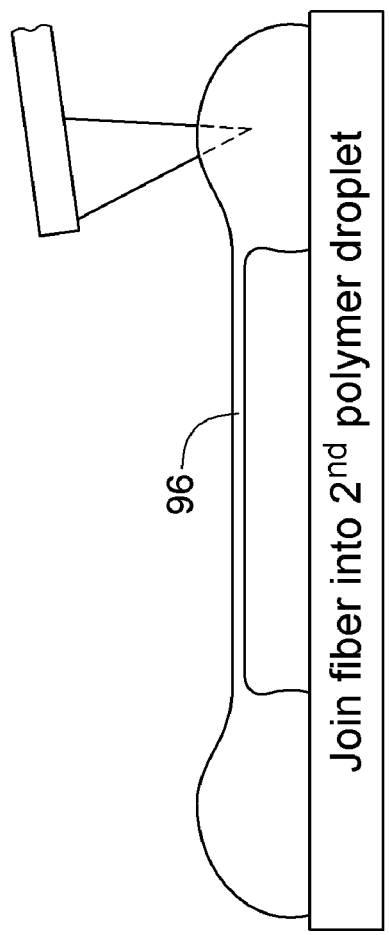

FIGS. 9A and 9B illustrate a preferred embodiment method for forming suspended polymer fiber. The process begins by drawing a tip 90 from a droplet 92 of liquid polymer in FIG. 9A. Polymer adheres between the tip and the polymer source leaving a fiber bridge as the AFM tip is pulled toward another droplet 94. In FIG. 9B, a fiber 96 connects to the other droplet 94, and the polymer can solidify to from the suspended polymer nanofiber.

The method of FIGS. 9A and 9B has been conducted experimentally, and fibers as long as one meter in length with diameters ranging from 20 µm down to 30 nm have been drawn by this method without breaking. Taut, sag-free suspended fibers bridging a gap of at least 100 µm and under 300 nm in diameter have been formed. The diameter of the bridge is controlled by a balance between mass transport while pulling, viscoelastic stresses in the elongating filament, the capillary forces driving the thinning process and the drying rate of the solvent. In fact, for short fibers, capillary forces appear to be the dominant force that drives a process since even large amounts of liquid polymer self-assemble into small diameter fibers. As a consequence of the large molecular elongation induced during the self-thinning process, these fibers, are rugged and flexible, despite their small diameters. This has been demonstrated by drawing fibers of several centimeters length and hand-twisting the fibers into loops of a few microns in diameter without breaking.

The fiber drawing has been demonstrated with various nanomanipulating instruments including the atomic force microscope, a nanometer precision milling instrument, and even by hand manipulation. Both single (serial) and multiple (parallel) drawing of fibers have been demonstrated. Example fibers have been drawn between two drops of commercial ebeam resist poly(methyl methacrylate) in chlorobenzene. A silicon carbide tip (tip radius 50 µm) was used to draw the fibers and the fiber net was placed in a computercontrolled nanometer-precision micromill. Nicely tapered fibers can be drawn from the polymer drop. A larger diameter fiber was drawn from a drop and attached to a distant drop. Two smaller tapers were formed by drawing from a distant drop to the drop. Since the drop is still solvated, the fiber is dissolved from the tip which cleans the tip for drawing additional fibers. Fibers down to 100 nm have been drawn by the serial method.

Rheological Properties of Liquid Measurement

As described above, polymer fibers can be formed by pulling a thread of polymeric liquid if the fiber solidifies before it breaks up by capillary thinning. Fiber diameter is well correlated with a processing parameter that is a simple function of viscosity, surface tension and evaporation rate. Not only can the effect of the processing parameter be observed in the atomic force microscope (AFM), but the fundamental material parameters can also be determined with the same AFM setup. The usual problem with tapered AFM tips, of liquids wetting unstably up the tapered AFM tip and even onto the cantilever, is resolved by the use of long cylindrical tips of constant diameter, which can be accomplished with a nanoneedle AFM tip.

The above methods of growing Ag—Ga nanoneedle (100 nm diameter, 7-70 microns long) onto AFM tips at room temperature provides constant diameter nanoneedles that can give clearly measurable force-distance curves when inserted through the surface of a liquid, which provides clean measurements of surface tension, contact angle, and evaporation rate, while shear viscosity is determined through Q-damping as a function of insertion distance into the liquid.

Additionally a single parameter P, the processing parameter gives a combined measure of the fiber properties anticipated when drawing a fiber from a polymer liquid.

The key material parameters of surface tension a, shear viscosity 7l and evaporation rate)(correlate with fiber geometry through the processing parameter $$P = \frac{\eta \chi}{\sigma}.$$

Its effect on fiber length can be illustrated by retracting a nearly cylindrical, parylene-coated needle on the tip of an AFM cantilever from aqueous solutions of $1.0 \times 10^6$ gm/mol molecular weight poly(ethylene oxide) (PEO). The concentration range corresponds to changes in processing parameter of around six orders of magnitude. At zero force the liquid thread breaks apart. The thread length at breakup corresponds to $$l_b = vt_b + \frac{F(t_0)}{k}$$

where the second term $F(t_o)/k$ accounts for the initial deflection of the cantilever when retraction starts. $F(t_o)$ is the initial force on the AFM cantilever and k is the cantilever spring constant. The length and time at fiber breakup increases as $$l_b = l_o P^{A_l}$$

$$t_b = t_o P^{A_t}$$

where the scale parameters $l_o$=62.5 gm and $t_o$=40 s, and the $A_l$=0.31 and $A_t$=0.33 for the slope of the log-log plot. The reduction in force with time corresponds directly to thinning of the fiber.

The detail for measuring each of these controlling parameters are explained as follows:

Surface Tension and Contact Angle

As a needle is being retracted, $F_r$, the force vector for the liquid-vapor interface, can momentarily be oriented in the direction of the needle. This corresponds to the point of maximum retraction force. Further retraction leads to a shorter contact line with less restraining force, which is overwhelmed by the retraction force, leading to the instability that produces the step change, or snap-out, on the F-D curve. Therefore, once $F_r$ is known, then the contact angle can be determined from the following $$F_e = F_r \cos \theta$$

Mass Transfer Rate

Evaporation rate is typically analyzed using thermogravimetric analysis (TGA), which reports the mass transfer rate. From this information one can calculate volume loss per unit of surface area. The evaporation rate z would then be in units of length per unit time. Current AFM's can clearly measure sub nanometer changes in surface heights of liquids between repetitive scans (at rates between 0.01-4 Hz). Use of a nanoneedle tipped AFM can improve the thermogravimetric analysis.

For a sample of known surface area and shape, the change in surface height per unit time due to evaporation l, can be related to z. For example testing, a liquid is filled to the lip of a cylindrical container (1 cm diameter), and the convex cap of liquid slightly protrudes above the lip. This enables easy insertion of the probe. In this arrangement the radius of curvature of the cap changes, rather than the height of the cylindrical column of liquid. Consideration of this specific geometry leads to $$\chi \approx 0.5 \frac{l}{t},$$

which appears to be accurate to within 2% for caps that protrude above the container less than 1/10 the radius of the container.

Shear Viscosity

Viscosity of liquids can be related to the damping they produce in a mechanical resonator. The AFM has a specific mode that directly measures the Q of a thermally-excited cantilever. When the needle of a needle-tipped cantilever is inserted into a liquid the Q of the resonator is reduced to $$Q = \frac{\sqrt{Mk_c}}{R}$$

where M is the effective mass of the cantilever, $k_c$ is the cantilever spring constant and R is the drag coefficient. Damping due to the liquid generally reduces the Q substantially, thereby eliminating the consideration of air damping on the cantilever. For long cylindrical needles the drag coefficient in the axial direction of the needle is [9]

$$R = \frac{F_d}{v} = \frac{4\pi\eta a}{\ln(2a/r) - 0.81} \quad r \ll a$$

where Fd is the drag force, a is the length of needle inserted into the liquid and v is the scan speed. Q can be related to viscosity n as $$\frac{1}{Q} = \frac{1}{\sqrt{Mk_c}} \frac{4\pi\eta a}{[\ln(2a/r) - 0.81]}.$$

Thus, the needle-tipped AFM probes can provide very detailed information about the properties of simple liquids and complex fluids, quickly, and in many cases interactively while using the AFM as a nanomanipulator.

Single Cell Attachment to Nanoneedles

Cells suspended in liquid can rapidly attach to surfaces and grow into confluent layers. This is of great importance in the field of tissue engineering and organ regeneration. Endothelial cells that make up microcapillaries are of great interest for this purpose. Tests have shown that endothelial cells are easily captured by the nanoneedles of the present invention.

In experiments, endothelial cells were cultured on a glass depression microscope slide under liquid medium at 37° C. for three days forming a confluent monolayer. This slide was transferred to the AFM keeping a small amount of liquid in the depression of the slide. Probing with a nanoneedle of the invention was performed at the edge of the liquid where the cells are wet by an ~1.5 μm (as determined by AFM F-D curve) think layer of media. The needle is inserted for about 2.5 μm into a single cell (at the center, thickest region of the cell, normal to it's 40 μm long by 10 μm wide footprint) using a force of 200 nN to break through the membrane. This scan is completed in under 2 seconds. Even at a retraction of 16 μm the cell still appears to be attached to the needle. The probe is removed from the AFM and transferred to the SEM where we see that the cell has conformed to the needle. It now lies along the needle and has the same appearance as it did when it was on the glass surface. That is, the cell has reoriented itself to conform to the needle. Surprisingly, tests show that the needle is now covered to a much greater length than the original insertion depth.

This procedure was repeated identically with three unused nanoneedles and the results replicated. On the other hand, the same experiment with dead cells shows no response to the nanoneedle probe. The nanoneedle used as a platform to support a much larger cell provides a very convenient, minimally-disturbing support for experimentation with the cell and investigation of how the cell interacts with other materials, surfaces and cells.

Biological Nanofiber Growth on Nanoneedle Probes

The blood cells in a freshly-drawn drop of blood settle quickly. The clear serum above the cells was dipped into repeatedly with a needle-tipped probe and the result is consistently needle with an attached fiber. This fiber is remarkable in that is diameter is close to that of the needle, which in on the order of 100 nm. The reason for the unexpected, but highly desirable fiber geometry, appears to be due to polymerization of monomers, rather than solidification through drying of a polymer in solution. The protein fibrin which is involved in the clotting of blood forms by polymerization of the monomer fibrinogen. It is believed that the fiber is composed of fibrin. Subsequent tests with pure extracts of fibrinogen and the ligating enzyme thrombin prove this material system does form fibers. Similar experiments demonstrate that polymer actin fibers can be formed from actin monomers. Also the organic monomer norbomene can be polymerized with Grubb's catalyst and fibers have been similarly from this reaction. All these reactions can be viewed as initiated polymerization, where the polymer is initiated by a catalyst or biological catalyst referred to as an enzyme.

Parallel Fabrication and Functionlization of Nanoneedles and Nanostructures

Other preferred methods of the invention provide for the parallel fabrication and functionalization of nanoneedles. Each individual nanoneedle formed can have any of the attributes, e.g., insulated, exposed tip, nanochannels, etc. as discussed above. Individual freestanding $Ag_2Ga$ nanoneedles, for example from 25 nm to 500 nm diameter and 3 to 70 micrometers long have been fabricated at selected locations and orientations, and can be formed quickly at room temperature. Parallel fabrication can also be conducted to fabricate many needles at the same time.

Pulling Nanolithography (PNL)

Figure 10A:
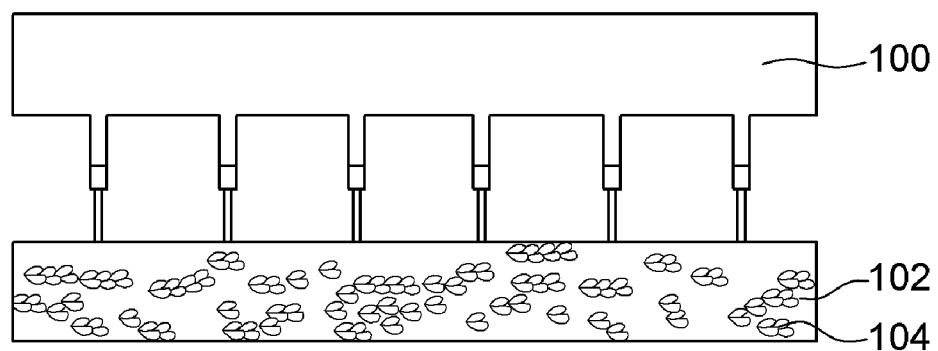
FIGS. 10A-10C illustrate a preferred embodiment method for parallel formation and nanomanipulation of molecular nanofibers.
Figure 10B:
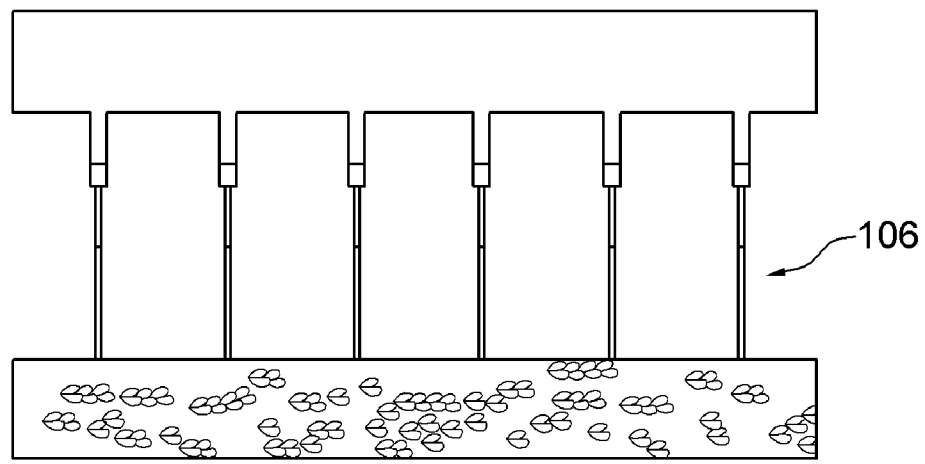
Figure 10C:
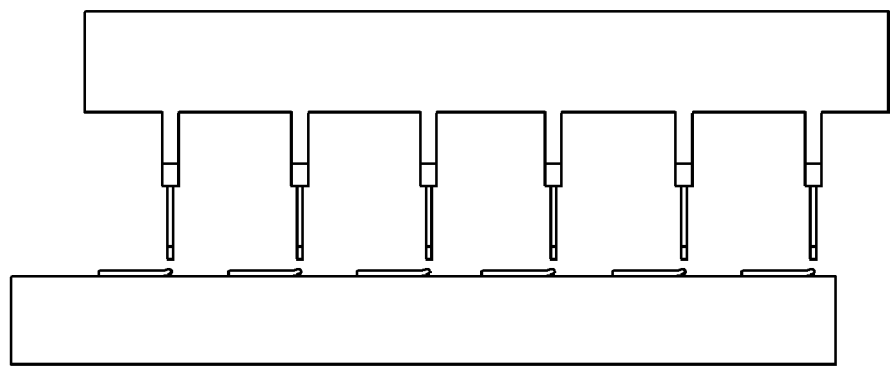

A parallel array of nanoneedles can also be used to form other nanostructures by a process that is called pulling nanolithography (PNL) as shown in FIG. 10A to 10C. An array of needles 100 formed by the invention. PNL can be used, for example, for drawing biological nanofibers by locally dipping (FIG. 10A) and then pulling the array from a liquid environment 102 saturated with proteins 104 (i.e. collagen, fibrin, etc.). These molecules polymerize at the end of each needle forming nanofibers 106 (FIG. 10B) and can then be transferred by brushing onto another surface to form a desirable pattern of nanofibers (FIG. 10C). This permits patterning many kinds of biological materials, as well as other nanomaterials, e.g., carbon nanotubes, in a single step.

Also, by pulling the array of nanoneedles 100 from viscous liquid (i.e. spin coated material for $SiO_2$, etc.), freestanding nanostructure of almost any kind of material can be made from any material that is initially in liquid state and dries to form solid fibers during the pulling process.

Biomolecular Sorting

Figure 11A:
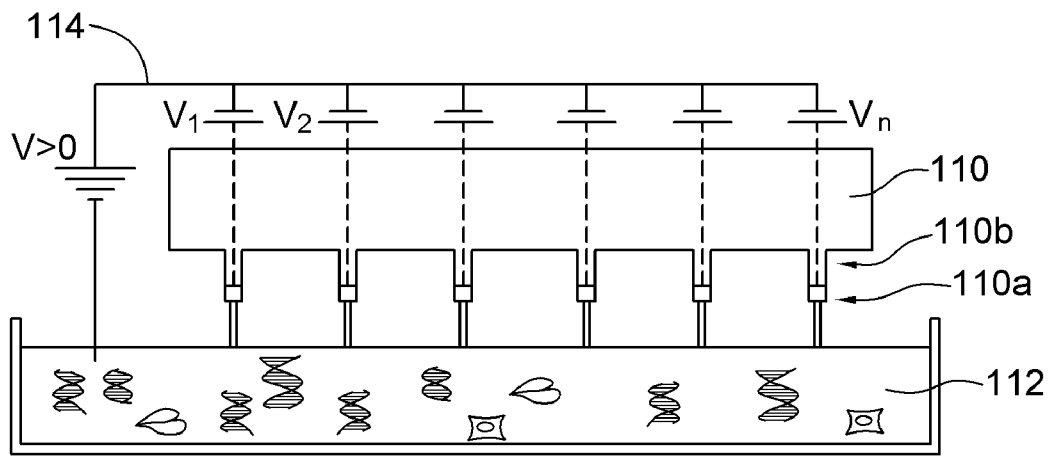
FIGS. 11A-11C illustrate a preferred embodiment method for biomolecular (e.g. DNA, protein, peptide, etc) separation.
Figure 11B:
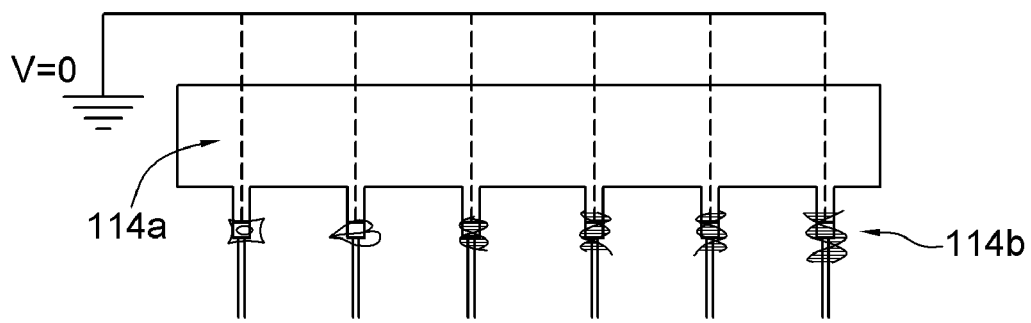
Figure 11C:
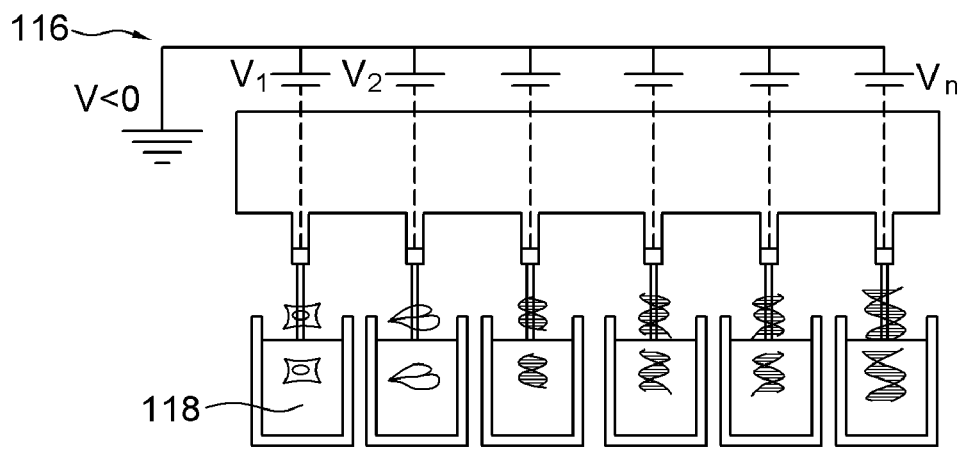

FIGS. 11A to 11C illustrate a preferred embodiment method for biomolecular separation using array of high aspect ratio nanoneedles. In a preferred method, an array of high aspect ratio nanoneedles 110 are dipped into a liquid 112 including a mixture of molecules with different molecular weight. Since each individual nanoneedles 110a is grown on a prefabricated microstructure 110b, different electric field strengths 114 is applied to each nanoneedle. Molecules with lower molecular weight 114a are absorbed into the needles hold at lower voltage and molecules with higher molecular weight 114b are absorbed into needles hold at higher voltage. Reversing the applied voltage 116 when the needles are dipped into individual dishes 118 resulting in the separation of molecules in large scale. In addition, since the molecules are in a liquid environment, approaching the needle array to the liquid surface with no feedback control would be possible.

Superpourous Nanostructures by De-Alloying

The nanoneedle, nanowire and other structures can be modified to have a very high porosity. The basic approach to achieve the porosity is alloy decomposition, which can be referred to as de-alloying. An example fabrication that has been conducted experimentally will be described.

De-alloying of Ga—Au and Ga—Pt thin films to produce superporous metal has been conducted. A thin film of Cr adhesion layer (~10 nm) is sputter-coated (RF, 300 W, 20 mtorr) on a $SiO_2$ substrate. Then, Au films between 10 nm and 150 nm thickness are sputter-coated (DC, 350 W, 20 mtorr) on the sample. Ga deposition and dealloying are performed using two different approaches as follows.

Approach #1: Ga reactive spreading is performed on Au films at (25° C. to 50° C.). The sample is then dealloyed for 60 to 90 minutes in 1 N Hydrochloric acid (HCl) at 60° C. Then, it is immersed in deionized (DI) water at 60° C. and dried in the air.

Approach #2: A 3 to 5 μm layer of Ga is thermally evaporated on the Au films. The evaporation is done using a Veeco thermal evaporator. A 55 to 60 A electric current is passed through a tungsten boat filled with Ga, at 5 mtorr pressure. The deposition rate is ~2 μm/min. The sample is then annealed at 50° C. for 3 hours and etched in 1 N HCl at 60° C. for 25 to 35 minutes. Then it is immersed in DI water at 60° C. and dried in the air. This approach permits large areas to react in parallel as opposed to the slow serial spreading in Approach #1.

After the etching steps using Approach #1, the Ga:Au composition of the film is 72:28 before and 15:85 after etching. The morphology of superporous gold depends on the film thickness of the original gold thin film. The thicker film (150 nm) has several porous layers, while the thinner film (30 nm) has a single web-like layer. In both films, filaments that define the pore walls as small as 5 nm and pores as small as 10 nm are observed.

Results for Approach #2: Since the Ga evaporation rate is high, the Ga coated layer is very rough. Droplets of Ga as large as a few microns are observed. Most of the Ga gets etched away and the film consists of several submicron grains that are packed together. Each individual grain is filled with pores of a few nanometers size. The superporous film appears brown under white light.

Following Approach #2 a 100 nm Au film is coated with Ga and then etched with HCl for various durations. At each time, the composition of the sample is characterized by EDS. The porosity of the film appears to increase with increasing etching time. The concentration of Au increases with etching time to as much as 99 at. % within 35 minutes.

Similar experiments with the samples prepared by Approach #1 show that the concentration of Au does not increase to more than 85% even after 90 minutes of HCl etching. This is likely due to the formation of $Ga_2O_3$.

Superporous Pt can be made by the same procedures as described in Approach #1 used to make superporous Au. Silicon or $SiO_2$ substrates are sputter-deposited with Cr (~10 nm thick) followed by a layer of Pt (50 to 150 nm thick). Ga is deposited on Pt by placing a drop of melted Ga on the substrate or by evaporating Ga. The displacement of the Ga droplet on metal thin film is achieved by dipping a tungsten tip inside a melted Ga droplet, and then scanning it across the metal film, leaving a line or droplet of liquid Ga nominally 50 to 500 μm wide and 5 to 10 μM in height. The sample is then aged at room temperature for 2 to 8 hours. For the samples on which Ga was deposited by evaporation, the sample is annealed on a hotplate at 200 to 300° C. for 8 hours. The de-alloying is done in two steps. First, the sample is etched in 1 N HCl for 10 to 30 minutes at 60° C., followed by etching in 40:1 $H_2O$:HF for 1 hour, at room temperature. Then the sample is rinsed with DI water and dried in the air.

After HCl etching for 30 minutes, several Ga/Pt crystals of micron and nanometer scale are exposed. After the second step of etching pores are evident in the crystals. Superporous crystals with pore sizes as small as 5 nm have been produced in experiments.

EDS data shows that the ratio of atomic concentration of Ga—Pt crystals is about 85:15 (~6:1) before etching. In addition, most of the crystals are formed in rectangular plates that are consistent with the orthorhombic crystalline structures of $Ga_6Pt$. These observations reveal that the crystals are most likely $Ga_6Pt$. X-ray diffraction studies are needed to complete the material characterization.

The atomic volume of the $Ga_6Pt$ crystals would be ~12.27× $10^{-23}$ $cm^3$. After dealloying, the ratio of GaPt concentration reduces to 17:83. This is equivalent to removing 5.795 of each 6 atoms of Ga from each $Ga_6Pt$ molecule. Thus the open void fraction is calculated by subtracting the atomic volume of the $Ga_6Pt$ crystal from the final volume of the $Ga_{0.205}Pt$ alloy and then dividing by the atomic volume of the $Ga_6Pt$. This gives an estimated open void fraction of 85%. A similar calculation for $AuGa_2$ etched to 99% purity gives an open void fraction of 70%.

Self-Assembly of Porous Thin Films

Porous thin film self-assembly is provided by embodiments of the invention. Consider a Ga-Metal crystal in an etchant (i.e. HCl). Initially, Ga will be dissolved from the top surface of the crystal. Gold atoms should accumulate on the surface and locally protect the crystal from further dissolution. However, experiments show films that are porous down to the substrate. These results suggest the following qualitative description of porous formation.

Consider that a single Ga atom is removed from the surface, which leaves behind a terrace vacancy. The Ga atoms surrounding this vacancy have fewer neighbors than others and thus have a greater tendency for dissolution. As a result the entire terrace is removed leaving behind Au atoms with no lateral coordination; these atoms are called adatoms. Before the second layer is attacked, the Au adatoms with local site occupancy are far from thermodynamic equilibrium. Thus, there is a strong driving force for Au adatoms to aggregate, forming small islands. Regions of the surface that have a uniformly high concentration of Au adatoms have free energy G(c) (where c is the gold concentration) that has a negative curvature (i.e. $d2G/dC2<0$) which is the condition for spinodal decomposition. Within the spinodal, an arbitrary small fluctuation in composition leads to a lower overall free energy for the system and causes atomic diffusion against the concentration gradient. The system then becomes unstable causing the spontaneous formation of the islands (in this case networks of Au wires that define the pore).

As a result, rather than a uniform Au layer over the top layer of the crystal, the surface consists of two distinct regions: pure Au regions that are locally passivated at the surface and unreacted areas that are exposed to the acid. In the early stages the Au clusters are mounds that are Au-rich at their peaks and are Ga-rich at their bases. These mounds get undercut, resulting in the formation of superporous Au.

In summary, superporous Pt and Au nanostructrues can be formed by selectively etching Ga from Ga-M intermetallic compounds. Superporous Pt and Au with open void fractions as high as 85% and feature sizes as small as 5 nm were produced using this method. Nanostructure formation caused by the etching is attributed to spinodal decomposition. This method of making porous metals has a number of desirable features. First, using low melting point Ga as one of the elements in the binary alloy is advantageous since Ga is a very reactive metal at room temperature and it can be completely removed from the Ga-M alloy with even a weak acid (e.g. dilute HCl). This results in the formation of nearly pure superporous metal. Second, the surface of a pre-existing electrode on a device can be made porous by direct Ga deposition on the electrode at or near room temperature, followed by etching. Third, the reaction of Ga with metal films creates micro and nano crystals of Ga-M can be quite thick, providing a large surface area.

Porous and non-porous electrodes were evaluated by constant voltage amperometry using a Quenteon L.L.C, FAST-12 high speed electrochemistry instrument. Fast Analytical Sensor Technology (FAST) software, written for simultaneous four channel recording, was used to collect the data. The microelectrodes were placed in a 50 ml beaker containing 40 ml of 0.05 M phosphate buffer solution (PBS), pH 7.4. The beaker was at room temperature and slowly stirred without creating a vortex. A potential of +0.7V with respect to the Ag/AgCl reference electrode was applied to the Pt electrodes. Hydrogen peroxide (40 µL, 8.8 mM) was added to the buffer to provide a final concentration of 8.8 µM $H_2O_2$.

Table 4 reports limit of detection (LOD), sensitivity, and linearity for each site of the four electrodes before and after the porosity treatment. The LOD is defined as the concentration that corresponds to a signal-to-noise level of 3. Root-mean-squared noise levels are calculated using 10 sample points. The sensitivity of each electrode is described as the slope of the current versus concentration plot in units of pA/µm. The goodness of fit to linear response of each electrode is described by the Pearson correlation coefficient.

TABLE 4

LIMIT OF DETECTION AND SENSITIVITY OF THE MICROELECTRODES BEFORE AND AFTER BEING MADE POROUS

|  | LOD (µM) | | Sensitivity (pA/µM) | | Sensitivity LOD (pA/µM$^2$) | | Linearity ($R^2$) | |
| --- | --- | --- | --- | --- | --- | --- | --- | --- |
|  | Before | After | Before | After | Before | After | Before | After |
| Ch. 1 | 0.062 | 0.141 | 0.025 | 0.137 | 0.571 | 0.972 | 0.997 | 0.982 |
| Ch. 2 | 0.050 | 0.154 | 0.041 | 0.147 | 0.822 | 0.954 | 0.9986 | 0.992 |
| Ch. 3 | 0.080 | 0.279 | 0.029 | 0.158 | 0.358 | 0.568 | 0.9959 | 0.996 |
| Ch. 4 | 0.079 | 0.182 | 0.036 | 0.178 | 0.452 | 0.982 | 0.9959 | 0.996 |

The sensitivity of the channels 1 to 4 has been increased by factors of 6, 3.5, 5.5 and 5 respectively, although the limit of detection has also been increased due to the increased noise level in the current measurement. The ratio of sensitivity to the limit of detection increases by an average factor of 1.7 (averaged over 1.7, 1.16, 1.58 and 2.17 from channel 1 to 4 respectively) after the treatment. These increases in the ratio of sensitivity may be surpassed with other superporous metals and different chemicals that can be sensed. Optimization of the processes of removing oxide and any remaining Ga should also enhance performance.

Self-Assembly of Nanoporous Polymers

Also superporous polymers can be made by decomposition of one of the block types of a block co-polymer used as a second or higher layer around a needle. This provides an alternative to removing the needle to make a porous channel or capillary. Instead fluids can be transported through the pores while the needle remains providing electrical conductivity and mechanical strength.

Oriented Nanomaterial Air-Bridges Formed from Suspended Polymer-Composite Nanofibers In a two-step method, carbon nanotubes, inorganic nanowires or graphene sheets are connected between two anchor points to form nanomaterial air-bridges. First, suspended polymer composite nanofibers are formed as discussed above. Then, the polymer is sacrificed by thermally-induced depolymerization and vaporization, leaving air bridges of the various materials. Composite fibers and bundles of nanotubes as thin as 10 nm that span 1 micron gaps have been formed by this method. Comparable bridges are observed by electrospinning solutions of the same nanomaterial-polymer composites onto micron-scale corrugated surfaces. This method for assembling nanomaterial air-bridges provides a convenient way to suspend nanomaterials for mechanical, and other, property determinations, and for subsequent device fabrication built up from the suspended nano-substrates.

The decomposition step can also be applied to suspended nanofibers formed by processes other than brushing, such as electrospinning. In an example process, a composite fiber of multiwall carbon nanotubes (MWNT) in poly(methyl methacrylate) (PMMA, 996,000 g/mol, Sigma-Aldrich) is electrospun onto the tops of micron diameter pillars from a chlorobenzene solution containing 1 wt % MWNT's and 4 wt % PMMA. The solution also contains less than 1 wt % of nanotube functionalization and residuals (which are analyzed by TGA, EDS and Raman below.) The nanotube functionalization is an adsorbed organic (trade name Kentera, Zyvex Corporation, Richardson, Tex.) that consists of an alkane group connected to a phenyl end group that adsorbs to the nanotube and an end group that enhances solubility of the nanotubes in chlorobenzene. The functionalized nanotubes and PMMA are both easily dispersed in chlorobenzene, leading to a well-mixed nanotube-PMMA solution. The electrospun fiber is then placed on a preheated hotplate in air at 450° C. (i.e., the sample is heated rapidly. If instead the sample is heated gradually, the bridges usually sag and fall onto the base of the pillars.) The temperature is maintained for 1 hr to ensure thorough removal of the polymer. The MWNT's that remain after decomposition form bridges. The nanotube bridges tend to have a tapered shape, which is probably due to capillary thinning of the melted PMMA fiber, prior to decomposition, while the broadly spread nanotubes on the top of the pillars is probably due to rapid wetting of melted PMMA, prior to decomposition.

Figure 12A:
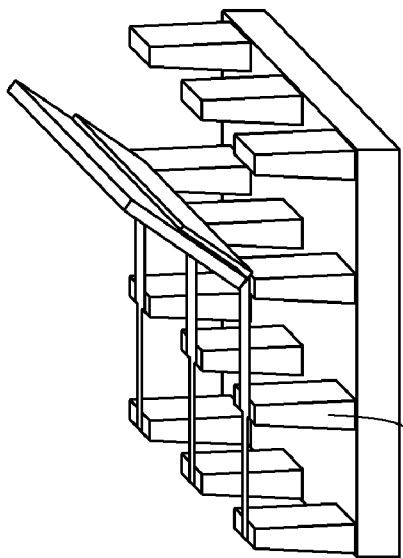
FIGS. 12A-12D illustrate a preferred embodiment method for forming suspended air bridges of polymers, polymer-nanomaterial composites and pure nanomaterials.
Figure 12B:
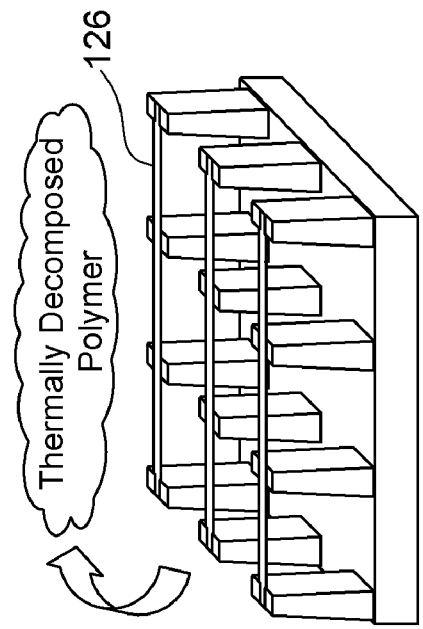
Figure 12C:
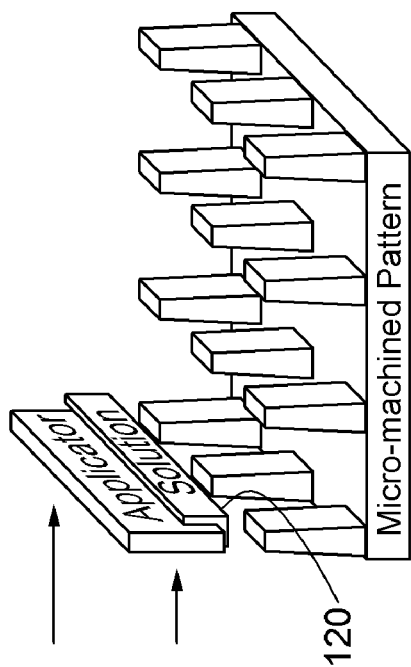
Figure 12D:
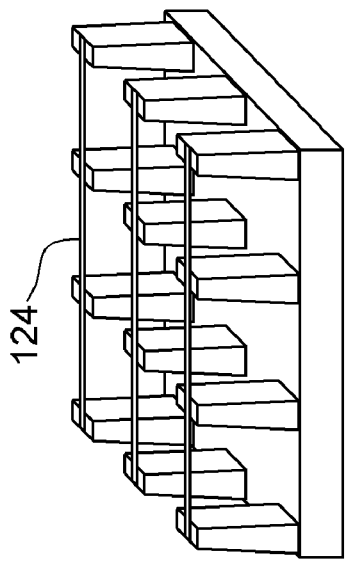

If the fibers are formed using a brush-on method, the fibers can be well oriented in the direction of brushing (sometimes with smaller fibers found in the cross direction.) Also the fibers can be suspended from either the tops of the pillars, or from the sidewalls of the pillars. FIGS. 12A-12D illustrate this process. In FIG. 12A, an application solution 120 is brushed across a micromachined or self-assembled pattern of micropillars. 122, which continues through FIGS. 12B and 12C. In 12C, polymer fibers 124 are suspended and oriented in the direction of brushing. Decomposition can form air bridges 126, e.g., nanotubes as in FIG. 12D.

Biopolymerization-Driven Self-Assembly of Nanofiber Air-Bridges

In a two-step method, biological materials such as collagen, chitosan, fibrin and actin are connected between two anchor points to form nanomaterial air-bridges and suspended nanomembranes. The formation of the fibers in three dimensions is driven by a process that is generally described as directed self-assembly, where userdefined initial conditions define the evolution of the self assembly process. In the process reported here a protein precursor in solution on an applicator (e.g. the edge of a microscope cover slip) is gently brushed by hand over an array of vertical pillars that are micron in diameter and tens of microns tall. The macroscopic brushing dynamics and the shape of the pillar array direct the assembly of protein solutions into nanostructures. Fibrin fibers, as small as 22 nm have been realized by this technique. Even smaller 16 nm diameter fibers were obtained for initiated polymerization of actin monomers.

The fabrication method consists of priming an array of microscale pillars with an appropriate initiator. In this case of fibrin air-bridges, a thrombin solution is first brushed over the array, followed by bushing a solution of fibrinogen. For actin fibers the array is primed with a solution of KCl that initiates polymerization when a solution of actin is brushed over the array in 1-2 seconds. The applicator sheet is typically a microscope cover slip or the very flexible plastic backing material on parafilm. In both cases the solution of the monomer is brushed over the array before the primer solution dries out. Different micro-structured surfaces are used as supports for the fibers. These arrays were obtained by micromachining of silicon, dicing grooves in glass and purchasing of TEM grids. The fibrin precursors were fibrinogen and thrombin, both obtained from American Diagnostica (Stamford, Conn.). Samples were prepared with and without factor XIIIa which is a known crosslinker that increases the extensibility of fibrin. The fibrinogen solution used (10 mg/ml in 20 mM HEPES, 100 mM NaCl, 5 mM EDTA, 7.5% Trehalsoe, pH 7.4, Mol. Wt. ~340,000 D) derived from human plasma depleted of plasminogen, fibronectin and factor XIIIa. The solution was heated in a bath at 37° C. until a clear solution is observed. The solution is maintained at this temperature during the brushing step. The thrombin used was specifically human alpha-thrombin (Mol. Wt ~37,000 D) generated by the proteolytic activation of the zymogen prothrombin. A concentration of 5 NIH units/ml of the thrombin was mixed in equal volume with 20 mM CaCl2. Factor XIIIa derived from human plasma was obtained from American Diagnostica as a stock solution in 50% (v/v) glycerol/water with 0.5 mM EDTA. It was diluted 100 fold in 20 mM CaCl2. The final solution was 1 Hl of the diluted factor XIIIa mixed with 200 Hl of the fibrinogen solution. The final concentration of factor XIIIa corresponds to 0.4 units/ml activity (where 1 unit corresponds to the activity of 1 ml of pooled normal human plasma.) The factor XIIIa is only mixed into the fibrinogen solution immediately before brushing. G-actin (the monomeric form of actin) derived from bovine muscle was obtained from Sigma-Aldrich (St. Louis, Mo.) as a dried powder in 2 mM Tris, pH 8.0 containing 0.2 mM ATP, 0.5 mM β-mercaptanol and 0.2 mM CaCl2. This powder was reconstituted in 50 mM KCl and 2 mM MgCl2 at a concentration of 1 mg/ml. A solution of 0.6 M KCl is used as the array primer that is used to initiate polymerization of the actin.

Force Sensing Through Nanoneedle Buckling

Another preferred method of force sensing is a calibrated method of force sensing in which the buckled shape of a long flexible nanoneedle, referred to as a 'nanoneedle', is interpreted to determine the applied force. Using a nanomanipulator the needle is buckled in the chamber of a scanning electron microscope (SEM) and the buckled shapes are recorded in SEM images. Force is determined as a function of deflection for an assumed elastic modulus by fitting the shapes using a generalized elastica model. Experiments have been conducted to demonstrate this model. Details of the experiments have been published in Dobrokhotov et al., "Visual Force Sensing with Flexible Nanowire Buckling Springs" Nanotechnology 19 (2008) 035502, which is incorporated by reference herein.

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

The invention claimed is:

1. A method for forming a plate-like blade nanostructure, the method comprising steps of:
   selecting a room temperature liquid metal gallium droplet and droplet size suitable for forming the plate-like blade nanostructure;
   selecting a microscopic tip of another material;
   coating the microscopic tip with a platinum layer;
   contacting the coated microscopic tip with the liquid metal droplet for a predetermined time that promotes the plate-like blade nanostructure; and
   gradually moving the microscopic tip away from the liquid metal droplet over a time period determined to produce the plate-like blade nanostructure.

2. A method for forming a rectangular bar nanostructure in a predetermined location, the method comprising steps of:
   forming a thin film chromium adhesion layer on a substrate;
   forming a gold film on the adhesion layer;
   depositing and alloying a layer of gallium on the gold film to form a rough gallium/gold alloy film with droplet structures on the film;
   selecting a room temperature liquid metal gallium droplet and droplet size suitable for forming the rectangular bar desired nanostructure;
   selecting a microscopic tip of another material;
   coating the microscopic tip with a platinum layer;
   contacting the coated microscopic tip with the gallium/gold alloy film for a predetermined time that promotes the rectangular bar nanostructure; and
   gradually moving the microscopic tip away from the gold alloy film over a time period determined to produced the rectangular bar nanostructure.

3. A method for forming a metal alloy nanostructure in a predetermined location, the method comprising steps of:
   selecting a desired metal alloy nanostructure shape to be formed;
   selecting a room temperature liquid gallium droplet and droplet size suitable for forming the desired nanostructure;
   selecting a microscopic tip of another material;
   coating the microscopic tip with a film of silver that will alloy with the liquid gallium droplet;
   contacting the coated microscopic tip with the liquid gallium droplet for a predetermined time that promotes the desired metal alloy nanostructure; and
   gradually moving the microscopic tip away from the liquid gallium droplet over a time period determined to produce the desired metal alloy nanostructure; and
   coating the metal alloy nanostructure with an electrically insulating layer.

4. The method of claim 3, wherein the metal alloy nanostructure comprises a metal alloy nanoneedle, the method further comprising a step of removing electrically insulating layer from a tip of the nanoneedle by side-to-side flexing during contact mode scanning of a deep and narrow trench in an atomic force microscope (AFM).

5. A method for forming a metal alloy nanoneedle in a predetermined location, the method comprising steps of
selecting a room temperature liquid gallium droplet and droplet size suitable for forming the desired metal alloy nanoneedle;
selecting a microscopic tip of another material;
coating the microscopic tip with a film of silver that will alloy with the liquid gallium droplet;
contacting the microscopic tip with the liquid gallium droplet for a predetermined time that promotes the desired metal alloy nanoneedle;
gradually moving the microscopic tip away from the liquid gallium droplet over a time period determined to produce the desired metal alloy nanoneedle; and
coating the metal alloy nanoneedle with alternating layers of insulator and metal.

6. The method in claim 5, further comprising a step of removing the alternating layers from the tip of the nanoneedle to form a multiconductor nanoelectrode.

7. A method for forming metal alloy nanotweezers, the method comprising steps of:
forming dual micropillars at the end of a microcantilever, with each micropillar having a separate electrical contact and each electrical contact having a separate electrical trace on the microcantilever;
selecting a room temperature liquid gallium droplet and droplet size suitable for forming the desired metal alloy nanoneedle;
selectively coating the micropillars with silver in a pattern that extends down the pillar and to the electrical contacts, wherein the silver is a metal that will alloy with the liquid gallium droplet;
contacting the micropillars with the liquid gallium droplet for a predetermined time that promotes formation of separate individual metal alloy nanoneedles along micropillar walls according to the pattern;
gradually moving the microscopic tip away from the liquid gallium droplet over a time period determined to produce the desired metal alloy nanoneedles, wherein the nanoneedles form opposing nanoneedles electrically connected to the electorodes to form electrostatically actuated nanogrippers.

8. A method for forming a plurality of nanostructures in predetermined locations, the method comprising steps of:
selecting a desired nanostructure shape to be formed;
selecting a room temperature liquid gallium droplet and droplet size suitable for forming the desired nanostructures;
delivering a plurality of the liquid metal droplets to specific locations;
selecting a plurality of the microscopic tips coated with a film of silver that will alloy with the liquid gallium droplets;
contacting the plurality of the microscopic tips to the plurality of the metal droplets for a predetermined time that promotes the desired nanostructures; and
gradually moving the plurality of microscopic tips away in a direction coincident with axes of the plurality of microscopic tips from the plurality of liquid gallium droplets over a time period determined to produce the desired plurality of nanostructures,
wherein the nanostructure comprises a plurality of nanostructures, further comprising etching away a central nanostructure, to form a hollow or porous nanoscale chamber, tube, or capillary.

9. A method of forming metal pores, the method comprising steps of:
selecting a room temperature liquid gallium droplet suitable for forming a desired metal alloy nanostructure;
selecting a microscopic tip of another material;
coating the microscopic tip with a film of silver that will alloy with the liquid gallium droplet;
contacting the microscopic tip with the liquid gallium droplet for a predetermined time that promotes the desired metal alloy nanostructure;
gradually moving the microscopic tip away from the liquid gallium droplet over a time period determined to produce the desired metal alloy nanostructure; and
selectively removing a metal to make pores in the nanostructure.

* * * * *

UNITED STATES PATENT AND TRADEMARK OFFICE
CERTIFICATE OF CORRECTION

PATENT NO. : 8,132,611 B2  
APPLICATION NO. : 12/156534  
DATED : March 13, 2012  
INVENTOR(S) : Robert W. Cohn et al.

Page 1 of 1

It is certified that error appears in the above-identified patent and that said Letters Patent is hereby corrected as shown below:

In the Specification:

| | |
|---|---|
| Col. 2, lines 66-67 | After "preferred embodiments, a" please delete "nanon-eedles" and insert --nanoneedle-- therefor. |
| Col. 3, line 28 | Please delete "Selectively" and insert --Selective-- therefor. |
| Col. 6, lines 50-51 | After "preferred embodiments, a" please delete "nanon-eedles" and insert --nanoneedle-- therefor. |
| Col. 7, line 41 | After "form an" please delete "allow" and insert --alloy-- therefor. |
| Col. 9, line 7 | After "useful" please delete the first instance of "as a". |
| Col. 17, line 30 | After "materials" please delete "that". |
| Col. 18, line 60 | After "solidify to" please delete "from" and insert --form-- therefor. |
| Col. 21, line 47 | Before "layer" please delete "think" and insert --thick-- therefor. |
| Col. 27, line 13 | After "followed by" please delete "bushing" and insert --brushing-- therefor. |

In the Claims:

| | |
|---|---|
| Col. 28, line 44 Claim 2 | After "determined to" please delete "produced" and insert --produce-- therefor. |
| Col. 30, line 15 Claim 8 | Before "droplets" please delete "metal" and insert --liquid gallium-- therefor. |

Signed and Sealed this  
First Day of October, 2013

Teresa Stanek Rea  
*Deputy Director of the United States Patent and Trademark Office*